(12) United States Patent
Yamada

(10) Patent No.: US 6,549,455 B2
(45) Date of Patent: Apr. 15, 2003

(54) MAGNETIC MEMORY DEVICE INCLUDING STORAGE ELEMENT EXHIBITING FERROMAGNETIC TUNNEL EFFECT

(75) Inventor: Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/985,770

(22) Filed: Nov. 6, 2001

(65) Prior Publication Data

US 2002/0054500 A1 May 9, 2002

(30) Foreign Application Priority Data

Nov. 9, 2000 (JP) ...................................... 2000-341489
Dec. 28, 2000 (JP) ...................................... 2000-399990

(51) Int. Cl.$^7$ ............................................. G11C 11/00
(52) U.S. Cl. ........................ 365/158; 365/171; 365/173
(58) Field of Search ................................ 365/158, 171, 365/173, 225.5, 87, 66

(56) References Cited

U.S. PATENT DOCUMENTS 5,946,227 A * 8/1999 Naji ........................... 365/158

FOREIGN PATENT DOCUMENTS

JP 8-63962 3/1996
JP 9-293387 11/1997

OTHER PUBLICATIONS

"Present Circumstances and Future Prospects of MRAM and Competitive Techniques" (Nov. 17, 2000), Data of the 116th Meeting of the Magnetic Society of Japan, p. 5.

* cited by examiner

Primary Examiner—David Lam
(74) Attorney, Agent, or Firm—Arent Fox Kintner Plotkin & Kahn, PLLC

(57) ABSTRACT

A magnetic memory device capable of preventing complication of the structure of an amplifier (sense amplifier) and enabling high-speed reading is provided. In this magnetic memory device, a memory cell is formed by a pair of first and second storage elements exhibiting a ferromagnetic tunnel effect and a pair of first and second transistors while an amplifier detects potential difference between a bit line and an inverted bit line connected to the pair of first and second storage elements. Thus, data can be readily read. Further, the value of a small current flowing to the bit line may not be detected dissimilarly to a case of forming the memory cell by a storage element exhibiting a ferromagnetic tunnel effect and a transistor. Consequently, the structure of the amplifier is not complicated. Further, no amplifier having a complicated structure may be employed, whereby high-speed reading is enabled.

24 Claims, 15 Drawing Sheets

MAGNETIC MEMORY DEVICE INCLUDING STORAGE ELEMENT EXHIBITING FERROMAGNETIC TUNNEL EFFECT

BACKGROUND OF THE INVENTION

1. Field of the Invention

The present invention relates to a magnetic memory device, and more specifically, it relates to a magnetic memory device including a storage element exhibiting a ferromagnetic tunnel effect.

2. Description of the Prior Art

An MRAM (magnetic random access memory) is generally known as a nonvolatile memory magnetically recording data. This MRAM is disclosed in detail in Nikkei Electronics, 1999, 11.15 (No. 757), pp, 49 to 56 etc.

FIGS. 18 and 19 are schematic diagrams for illustrating the structure of a storage element 110 of the MRAM disclosed in the aforementioned literature. Referring to FIG. 18, the storage element 110 of the conventional MRAM comprises a ferromagnetic layer 101, another ferromagnetic layer 103 and a nonmagnetic layer 102 arranged between the ferromagnetic layers 101 and 103.

The ferromagnetic layer 101 is harder to invert than the ferromagnetic layer 103. A substance exhibiting ferromagnetism, which is magnetism provided by magnetic atoms or free atoms of a metal arranging magnetic moments in parallel with each other by positive exchange interaction for forming spontaneous magnetization, is referred to as a ferromagnetic substance. The ferromagnetic layers 101 and 103 consist of such a ferromagnetic substance. In general, a GMR (giant magnetoresistance) film employing a metal is applied to the nonmagnetic layer 102. Recently, a TMR (tunneling magnetoresistance) film employing an insulator is developed for the nonmagnetic layer 102. The TMR film advantageously has larger resistance than the GMR film. More specifically, the MR ratio (rate of resistance change) of the GMR film is at the level of 10%, while that of the TMR film is at least 20%. The storage element 110 consisting of the TMR film is hereinafter referred to as a TMR element 110.

The principle of storage of the conventional MRAM employing the TMR element 110 is now described with reference to FIGS. 18 and 19. Such a state that the two ferromagnetic layers 101 and 103 are magnetized in the same direction (parallel) is associated with data "0", as shown in FIG. 18. Such a state that the two ferromagnetic layers 101 and 103 are magnetized in opposite directions (antiparallel) is associated with data "1", as shown in FIG. 19. The TMR element 110 exhibits small resistance ($R_0$) when magnetized in the parallel direction, while exhibiting large resistance ($R_1$) when magnetized in the antiparallel directions. The data "0" and "1" are distinguished from each other through this property of the TMR element 110 having the resistance varying with the directions of magnetization.

FIG. 20 is a block diagram showing the overall structure of a conventional MRAM 150 having memory cells each formed by a single TMR element and a single transistor. The structure of the conventional MRAM 150 is now described with reference to FIG. 20.

A memory cell array 151 is formed by a plurality of memory cells 120 arranged in the form of a matrix (FIG. 20 shows only four memory cells 120 for simplifying the illustration). Each memory cell 120 is formed by a TMR element 110 and an NMOS transistor 111.

In the memory cells 120 arranged in a row direction, gates of the NMOS transistors 111 are connected to common read word lines $RWL_1$ to $RWL_n$. In the memory cells 120 arranged in the row direction, further, rewrite word lines $WWL_1$ to $WWL_n$ are arranged on first ferromagnetic layers of the TMR elements 110.

In the memory cells 120 arranged in a column direction, first ferromagnetic layers of the TMR elements 110 are connected to common bit lines $BL_1$ to $BL_n$.

The read word lines $RWL_1$ to $RWL_n$ are connected to a row decoder 152, and the bit lines $BL_1$ to $BL_n$ are connected to a column decoder 153.

Externally specified row and column addresses are input in an address pin 154. The row and column addresses are transferred from the address pin 154 to an address latch 155. In the addresses latched by the address latch 155, the row address is transferred to the row decoder 152 through an address buffer 156, while the column address is transferred to the column decoder 153 through the address buffer 156.

The row decoder 152 selects a read word line RWL corresponding to the row address latched by the address latch 155 from the read word lines $RWL_1$ to $RWL_n$ while selecting a rewrite word line WWL corresponding to the row address latched by the address latch 155 from the rewrite word lines $WWL_1$ to $WWL_n$. Further, the row decoder 152 controls the potentials of the read word lines $RWL_1$ to $RWL_n$ and the rewrite word lines $WWL_1$ to $WWL_n$ on the basis of a signal from a voltage control circuit 157.

The column decoder 153 selects a bit line BL corresponding to the column address latched by the address latch 155 from the bit lines $BL_1$ to $BL_n$, while controlling the potentials of the bit lines $BL_1$ to $BL_n$ on the basis of a signal from another voltage control circuit 158.

Externally specified data is input in a data pin 159. This data is transferred from the data pin 159 to the column decoder 153 through an input buffer 160. The column decoder 153 controls the potentials of the bit lines $BL_1$ to $BL_n$ in correspondence to the data.

Data read from an arbitrary memory cell 120 is transferred from the bit lines $BL_1$ to $BL_n$ to a sense amplifier group 161 through the column decoder 153. The sense amplifier group 161 is formed by current sense amplifiers. The data determined by the sense amplifier group 161 is output from an output buffer 162 through the data pin 159.

A control core circuit 163 controls the operations of the aforementioned circuits 152 to 162.

A write (rewrite) operation and a read operation of the conventional MRAM 150 having the aforementioned structure are now described.

(Write Operation)

In the write operation, orthogonal currents are fed to the selected rewrite word line WWL and the selected bit line BL. Thus, only the TMR element 110 arranged on the intersection between the bit line BL and the rewrite word line WWL can be rewritten. More specifically, the currents flowing to the rewrite word line WWL and the bit line BL generate magnetic fields, so that the sum (composite field) of the two magnetic fields acts on the TMR element 110. The direction of magnetization of the TMR element 110 is inverted from "1" to "0", for example, due to the composite field.

The remaining TMR elements 110 include those fed with no currents and those only unidirectionally fed with currents. In the TMR elements 110 fed with no currents, no magnetic fields are generated and hence the directions of magnetization remain unchanged. In the TMR elements 110 only unidirectionally fed with currents, the magnitudes of generated magnetic fields are insufficient for inverting the directions of magnetization. Therefore, the directions of magnetization remain unchanged also in the TMR elements 110 only unidirectionally fed with currents.

As hereinabove described, the direction of magnetization of the TMR element 110 located on the intersection between the bit line BL and the rewrite word lines WWL corresponding to the selected address can be changed to that shown in FIG. 18 or 19 by feeding currents to the selected bit line BL and the selected rewrite word line WWL. Thus, the data "0" or "1" can be written.

Read Operation

In order to read the data written in the aforementioned manner, a voltage is applied to the read word line RWL for rendering the NMOS transistor 111 conductive. In this state, a determination is made as to whether or not the value of a current flowing to the bit line BL is larger than a reference current value, thereby determining "1" or "0".

In this case, the data "0" shown in FIG. 18 exhibits a small resistance value ($R_0$) due to the parallel direction of magnetization. Therefore, the value of the current flowing to the bit line BL is larger than the reference current value. On the other hand, the data "1" shown in FIG. 19 exhibits a larger resistance value ($R_1$) than that shown in FIG. 18 due to the antiparallel directions of magnetization. Therefore, the value of the current flowing to the bit line BL is smaller than the reference current value.

In the aforementioned conventional MRAM 150, the potential of the bit line BL must be set to a slight level (not more than 0.4 V) for detecting the current value in data reading. This is because resistance change in the TMR element 110 cannot be confirmed unless potential difference applied across the TMR element 110 is slight. Therefore, the potential difference applied across the TMR element 110 must be slight (not more than 0.4 V), leading to the value of a small current. In general, the structure of a sense amplifier (amplifier) is disadvantageously complicated for detecting such the value of a small current. Further, the reading speed is disadvantageously reduced for detecting the small current value.

SUMMARY OF THE INVENTION

An object of the present invention is to provide a magnetic memory device not complicating the structure of a sense amplifier (amplifier).

Another object of the present invention is to provide a magnetic memory device capable of improving a reading speed as compared with a case of determining data by detecting the value of a small current.

Still another object of the present invention is to simplify replacement from a DRAM in the aforementioned magnetic memory device.

A magnetic memory device according to a first aspect of the present invention comprises a memory cell consisting of a first storage element and a second storage element exhibiting a ferromagnetic tunnel effect and first and second transistors connected to the first and second storage elements respectively, a word line connected to control terminals of the first and second transistors, a bit line connected to the first storage element through the first transistor, an inverted bit line connected to the second storage element through the second transistor for forming a pair of bit lines with the bit line, and an amplifier connected to the bit line and the inverted bit line. The magnetic memory device inputs a signal in a selected word line while reading potential difference caused between the bit line and the inverted bit line by inputting the signal in the word line through the amplifier in data reading.

In the magnetic memory device according to the first aspect, the memory cell is formed by the pair of first and second storage elements exhibiting a ferromagnetic tunnel effect and the pair of first and second transistors while the amplifier detects the potential difference between the bit line and the inverted bit line connected to the pair of first and second storage elements, whereby data can be readily read. Thus, it is not necessary to detect the value of a small current flowing to the bit line dissimilarly to the case of a conventional memory cell formed by a storage element exhibiting a ferromagnetic tunnel effect and a transistor. Consequently, the structure of the amplifier is not complicated. Further, the potential difference caused between the bit line and the inverted bit line by inputting the signal in the word line is read through the amplifier, whereby detection can be readily made also when the storage elements have high resistance, dissimilarly to the conventional case of reading the value of a small current flowing to the bit line.

In the magnetic memory device according to the first aspect, the amplifier detects the potential difference between the bit line and the inverted bit line as described above, whereby data stored in the magnetic memory device can be read through a simple amplifier similar to an amplifier (sense amplifier) employed for a conventional DRAM. Thus, no sense amplifier having a complicated structure may be employed dissimilarly to the case of the conventional memory cell formed by a storage element exhibiting a ferromagnetic tunnel effect and a transistor, whereby high-speed reading is enabled. Further, the structure of the sense amplifier, the circuit structure and an operating method are similar to those of the conventional DRAM, whereby the technique of the DRAM can be utilized as such. Consequently, replacement from the DRAM can be readily attained.

In the magnetic memory device according to the aforementioned first aspect, each of the first storage element and the second storage element preferably includes a first magnetic layer and a second magnetic layer, harder to invert than the first magnetic layer, opposed to the first magnetic layer through an isolation barrier layer, and the second magnetic layer of the first storage element and the second magnetic layer of the second storage element are preferably connected with each other, while the magnetic memory device preferably further comprises a sub-word line for lowering the potentials of the second magnetic layer of the first storage element and the second magnetic layer of the second storage element to a ground potential in response to a rise timing of the signal to the word line. According to this structure, the sub-word line can readily lower the potentials of the second magnetic layers of the first and second storage elements toward the ground potential. Thus, potential difference can be caused between the bit line and the inverted bit line due to the difference between the resistance values of the first and second storage elements when lowering the potentials of the second magnetic layers of the first and second storage elements to the ground potential. Stored data can be readily detected by detecting the potential difference through the amplifier.

In the magnetic memory device according to the aforementioned first aspect, a fall timing of the signal to the word line is preferably set before the potential of a second magnetic layer of the first storage element and the potential of a second magnetic layer of the second storage element reach a ground potential. According to this structure, disappearance of the potential difference between the bit line and the inverted bit line can be prevented. The potential difference between the bit line and the inverted bit line is caused only in a transient state. When the potentials of the second magnetic layers of the first and second storage elements reach the ground potential, therefore, the potentials of the bit line and the inverted bit line connected to the first magnetic layers also reach the ground potential. Consequently, the A potential difference between the bit line and the inverted bit line disappears. According to the present invention, the signal to the word line falls before the potentials of the second magnetic layers of the first and second storage elements reach the ground potential, so that the amplifier can detect the potential difference between the bit line and the inverted bit line before the potential difference disappears.

The magnetic memory device according to the aforementioned first aspect preferably further comprises an isolation transistor for isolating the amplifier from the bit line and the inverted bit line in response to a fall timing of the signal to the word line. According to this structure, the isolation transistor isolates the amplifier from the bit lie and the inverted bit line before the potentials of the second magnetic layers of the first and second storage elements reach the ground potential, whereby the amplifier can read the potential difference between the bit line and the inverted bit line.

In the magnetic memory device according to the aforementioned first aspect, the first storage element and the second storage element preferably store inverted data. According to this structure, the data can be readily read due to the difference in resistance between the first and second storage elements.

The magnetic memory device according to the aforementioned first aspect preferably further comprises a dummy bit line connected to the first storage element through the first transistor and a detection circuit detecting a fall timing of the dummy bit line. According to this structure, a fall timing of the bit line can be detected through the dummy bit line and the detection circuit. Thus, when the amplifier detects the potential difference between the bit line and the inverted bit line at the detected timing, the stored data can be readily read. In this case, the magnetic memory device preferably further comprises an isolation transistor for isolating the amplifier from the bit line and the inverted bit line in response to the fall timing of the dummy bit line detected by the detection circuit, and the aforementioned amplifier is preferably activated in response to the fall timing of the dummy bit line detected by the detection circuit. According to this structure, the amplifier can readily detect the potential difference between the bit line and the inverted bit line.

In the magnetic memory device according to the aforementioned first aspect, the detection circuit preferably includes a first transistor having a gate receiving an applied input voltage and a second transistor having a gate receiving an applied reference voltage, and a current flowing to the first transistor is preferably rendered larger than a current flowing to the second transistor thereby outputting a low level when the input voltage is equivalent to the reference voltage. According to this structure, the output can be effectively prevented from being undefined when the input voltage is identical to the reference voltage. In this case, the gate width of the first transistor may be larger than the-gate width of the second transistor, or the gate length of the first transistor may be smaller than the gate length of the second transistor.

In the magnetic memory device according to the aforementioned first aspect, a current is preferably fed to a selected sub-word line downward from above while feeding currents of opposite directions to the bit line and the inverted bit line in data writing, thereby writing inverted data in the first magnetic layer of the first storage element and the first magnetic layer of the second storage element. According to this structure, data can be readily written.

A magnetic memory device according to a second aspect of the present invention comprises a memory cell consisting of a storage element exhibiting a ferromagnetic tunnel effect including a first magnetic layer, a second magnetic layer having a surface opposed to a surface of the first magnetic layer through a first isolation barrier layer and a third magnetic layer opposed to another surface of the second magnetic layer through a second isolation barrier layer and first and second transistors connected to the first magnetic layer and the third magnetic layer of the storage element respectively, a word line connected to control terminals of the first and second transistors, a bit line connected to the first magnetic layer through the first transistor, an inverted bit line connected to the third magnetic layer through the second transistor for forming a pair of bit lines with the bit line, and an amplifier connected to the bit line and the inverted bit line. The magnetic memory device inputs a signal in a selected word line while reading potential difference caused between the bit line and the inverted bit line by inputting the signal in the word line in data writing.

In the magnetic memory device according to the second aspect, the memory cell is formed by the single storage element exhibiting a ferromagnetic tunnel effect including the first, second and third magnetic layers and the pair of first and second transistors while the amplifier detects the potential difference between the bit line and the inverted bit line connected to the first and third magnetic layers, whereby data can be readily read. Thus, it is not necessary to detect the value of a small current flowing to the bit line dissimilarly to the case of the conventional memory cell formed by a storage element exhibiting a ferromagnetic tunnel effect and a transistor. Consequently, the structure of the amplifier is not complicated. Further, the potential difference caused between the bit line and the inverted bit line by inputting the signal in the word line is read through the amplifier, whereby detection can be readily performed also when the storage element has high resistance, dissimilarly to the conventional case of reading the value of a small current flowing to the bit line.

In the magnetic memory device according to the second aspect, further, the memory cell is formed by the single storage element exhibiting a ferromagnetic tunnel effect including the first, second and third magnetic layers and the pair of first and second transistors, whereby the area of the memory cell can be reduced as compared with a memory cell formed by two storage elements and two transistors.

In the magnetic memory device according to the second aspect, in addition, the amplifier detects the potential difference between the bit line and the inverted bit line, whereby data stored in the magnetic memory device can be read through a simple amplifier similar to an amplifier (sense amplifier) applied to a conventional DRAM. Thus, no sense amplifier having a complicated structure may be employed dissimilarly to the case of the conventional memory cell formed by a storage element exhibiting a ferromagnetic tunnel effect and a transistor, whereby high-speed reading is enabled. The structure of the sense amplifier, the circuit structure and an operating method are similar to those of a conventional DRAM, whereby the technique of the DRAM can be utilized as such. Consequently, replacement from a DRAM can be readily attained.

In the magnetic memory device according to the aforementioned second aspect, the first magnetic layer preferably includes a sidewall-shaped first magnetic layer formed on a side surface of the second magnetic layer through the first isolation barrier layer, and the third magnetic layer preferably includes a sidewall-shaped third magnetic layer formed on another side surface of the second magnetic layer through the second isolation barrier layer. According to this structure, the single storage element consisting of the first, second and third magnetic layers can be readily formed. In this case, the sidewall shaped first and third magnetic layers are preferably formed by forming a magnetic material layer through an isolation barrier material layer to cover the second magnetic layer and thereafter anisotropically etching the magnetic material layer. According to this structure, the single storage element consisting of the first, second and third magnetic layers can be readily formed through a process similar to a conventional sidewall forming process.

In the magnetic memory device according to the aforementioned second aspect, the first magnetic layer and the third magnetic layer are preferably formed in a staggered manner with respect to the second magnetic layer.

In the magnetic memory device according to the aforementioned second aspect, the second magnetic layer of the storage element is preferably formed to be harder to invert than the first magnetic layer and the third magnetic layer, and the magnetic memory device preferably further comprises a sub-word line for lowering the potential of the second magnetic layer of the storage element to a ground potential in response to a rise timing of the signal to the word line. According to this structure, the sub-word line can readily lower the potential of the second magnetic layer of the storage element toward the ground potential. Thus, potential difference can be caused between the bit line and the inverted bit line due to difference in the resistance value of the storage element. The amplifier detects the potential difference, so that stored data can be readily detected.

In the magnetic memory device according to the aforementioned second aspect, a fall timing of the signal to the word line is preferably set before the potential of the second magnetic layer of the storage element reaches a ground potential. According to this structure, disappearance of the potential difference between the bit line and the inverted bit line can be prevented. The potential difference between the bit line and the inverted bit line is caused only in a transient state. When the potential of the second magnetic layer of the storage element reaches the ground potential, therefore, the potentials of the bit line and the inverted bit line connected to the first and third magnetic layers also reach the ground potential. Consequently, the potential difference between the bit line and the inverted bit line disappears. According to the present invention, the signal to the word line falls before the potential of the second magnetic layer of the storage element reaches the ground potential, whereby the amplifier can detect the potential difference between the bit line and the inverted bit line before the potential difference disappears.

The magnetic memory device according to the aforementioned second aspect preferably further comprises an isolation transistor for isolating the amplifier from the bit line and the inverted bit line in response to a fall timing of the signal to the word line. According to this structure, the isolation transistor isolates the amplifier from the bit line and the inverted bit line before the potential of the second magnetic layer of the storage element reaches the ground potential, whereby the amplifier can read the potential difference between the bit line and the inverted bit line.

In the magnetic memory device according to the aforementioned second aspect, the first magnetic layer and the third magnetic layer preferably store inverted data. According to this structure, data can be readily read through the difference in resistance between the first and second magnetic layers and the third and second magnetic layers.

A magnetic memory device according to a third aspect of the present invention comprises a memory cell consisting of a storage element exhibiting a ferromagnetic tunnel effect including a first magnetic layer, a second magnetic layer having a surface opposed to a surface of the first magnetic layer through a first isolation barrier layer and a third magnetic layer opposed to another surface of the second magnetic layer through a second isolation barrier layer, and first and second transistors connected to the first magnetic layer and the third magnetic layer of the storage element respectively.

In the magnetic memory device according to the third aspect, the memory cell is formed by the single storage element exhibiting a ferromagnetic tunnel effect including the first, second and third magnetic layers and the pair of first and second transistors as described above, whereby the area of the memory cell can be reduced as compared with a memory cell formed by two storage elements and two transistors.

In the magnetic memory device according to the aforementioned third aspect, the first magnetic layer preferably includes a sidewall-shaped first magnetic layer formed on a side surface of the second magnetic layer through the first isolation barrier layer, and the third magnetic layer preferably includes a sidewall-shaped third magnetic layer formed on another side surface of the second magnetic layer through the second isolation barrier layer. According to this structure, the single storage element consisting of the first, second and third magnetic layers can be readily formed. In this case, the sidewall-shaped first and third magnetic layers are preferably formed by forming a magnetic material layer through an isolation barrier material layer to cover the second magnetic layer and thereafter anisotropically etching the magnetic material layer. According to this structure, the single storage element consisting of the first, second and third magnetic layers can be readily formed through a process similar to a conventional sidewall forming process.

In the magnetic memory device according to the aforementioned third aspect, the first magnetic layer and the third magnetic layer are preferably formed in a staggered manner with respect to the second magnetic layer.

In the magnetic memory device according to the aforementioned third aspect, the first magnetic layer and the third magnetic layer preferably store inverted data. According to this structure, data can be readily read through difference in resistance between the first and second magnetic layers and the third and second magnetic layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
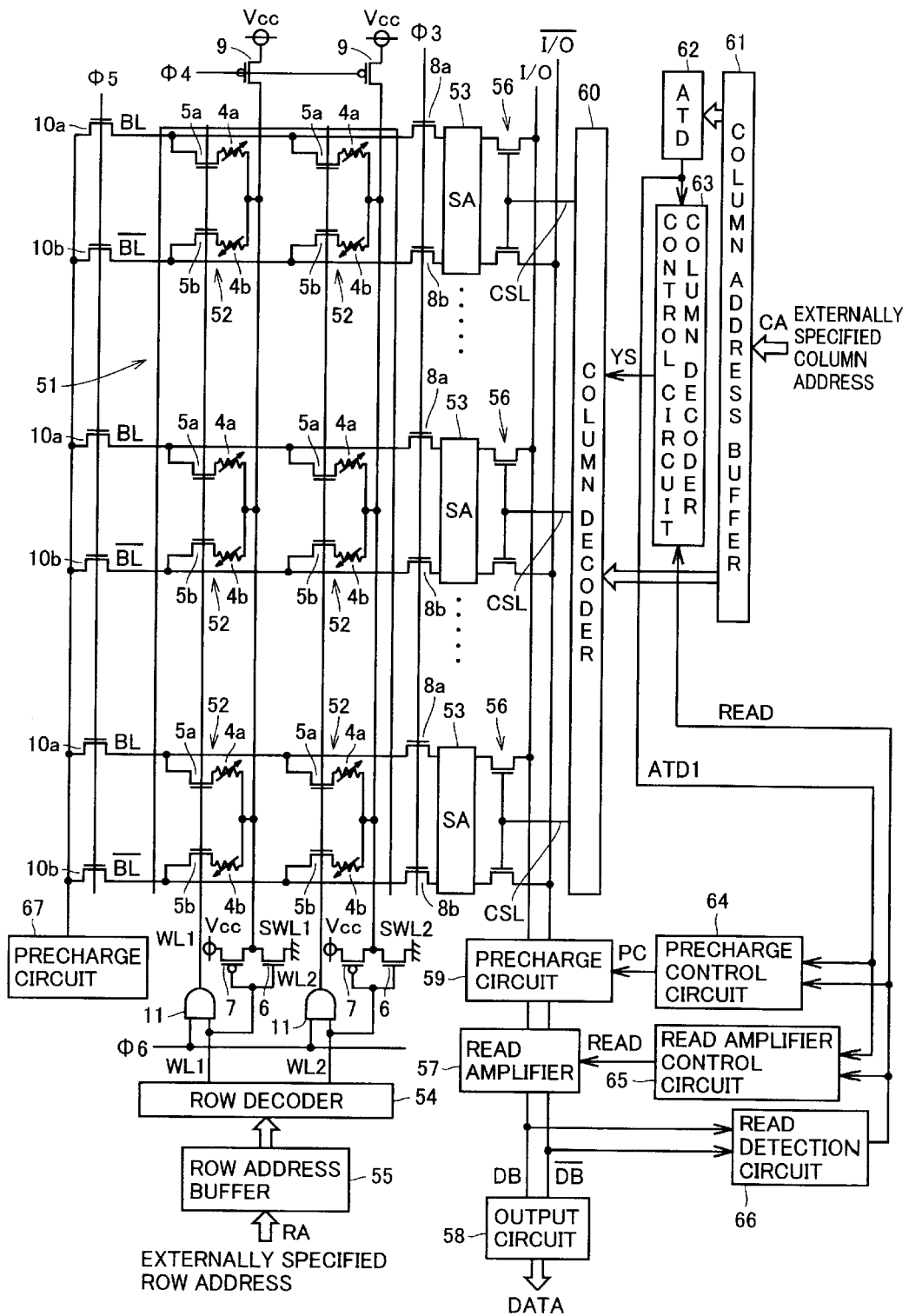
FIG. 1 is a block diagram showing the overall structure of an MRAM according to a first embodiment of the present invention.

Embodiments of the present invention are now described with reference to the drawings.

First Embodiment

The overall structure of an MRAM according to a first embodiment of the present invention is described with reference to FIGS. 1 and 2. The MRAM according to the first embodiment is similar in structure to the conventional DRAM except a memory cell array. The MRAM is now specifically described. The MRAM according to the first embodiment is mainly formed by a matrix-shaped memory cell array 51. The memory cell array 51 is formed by memory cells 52 arranged in row and column directions. Each memory cell 52 stores 1-bit data forming the minimum unit of storage.

In the MRAM according to the first embodiment, each memory cell 52 is formed by two TMR elements 4a and 4b and two NMOS transistors 5a and 5b. The TMR element 4a includes a ferromagnetic layer 3a, an isolation barrier layer 2a and another ferromagnetic layer 1a harder to invert than the ferromagnetic layer 3a, as shown in FIG. 2. The TMR element 4b includes a ferromagnetic layer 3b, an isolation barrier layer 2b and another ferromagnetic layer 1b harder to invert than the ferromagnetic layer 3b. A word line WL is connected to the gates of the two NMOS transistors 5a and 5b.

The TMR element 4a is an example of the "first storage element exhibiting a ferromagnetic tunnel effect" according to the present invention, and the TMR element 4b is an example of the "second storage element exhibiting a ferromagnetic tunnel effect" according to the present invention. The ferromagnetic layers 3a and 3b are examples of the "first magnetic layer" according to the present invention, and the ferromagnetic layers 1a and 1b are examples of the "second magnetic layer" according to the present invention. The NMOS transistors 5a and 5b are examples of the "first transistor" and the "second transistor" according to the present invention respectively. The gates of the two NMOS transistors 5a and 5b are examples of the "control terminal" according to the present invention.

In the memory cell array 51, each memory cell 52 arranged in the row direction (vertical direction in FIG. 1) is connected to the word line WL and a sub-word line SWL. Each memory cell 52 arranged in the column direction (transverse direction in FIG. 1) is connected to a bit line BL and an inverted bit line /BL. The inverted bit line /BL forms a pair of bit lines with the bit line BL corresponding thereto.

Each pair of bit lines BL and /BL are connected to each cross-coupled latch type sense amplifier (SA) 53. In each pair of bit lines BL and /BL, signal levels of the bit line BL and the inverted bit line /BL complementarily change. NMOS transistors 8a and 8b are provided between each pair of bit lines BL and /BL and each sense amplifier (SA) 53 for isolating each pair of bit lines BL and /BL from each sense amplifier (SA) 53. A signal line 43 is connected to the gates of the NMOS transistors 8a and 8b. The NMOS transistors 8a and 8b are examples of the "isolation transistor" according to the present invention. The sense amplifier 53 is an example of the "amplifier" according to the present invention.

Each word line WL is connected to a row decoder 54. An externally specified row address RA is supplied to the row decoder 54 from a row address buffer 55. Thus, the row decoder 54 selects the word line WL corresponding to the row address RA.

A first end of the sub-word line SWL is connected to each word line WL through an inverter circuit including an NMOS transistor 6 and a PMOS transistor 7. A power supply potential Vcc is connected to a second end of the sub-word line SWL through a PMOS transistor 9. A signal line Φ4 is connected to the gate of the PMOS transistor 9.

The word line WL is connected to a first input terminal and an output terminal of an AND circuit 11. A signal line Φ6 regularly reaching zero (low level) in writing is connected to a second input terminal of the AND circuit 11.

NMOS transistors 10a and 10b are connected to the bit line BL and the inverted bit line /BL respectively. A signal line Φ5 is connected to the gates of the NMOS transistors 10a and 10b. First ends of the NMOS transistors 10a and 10b are connected with each other. A precharge circuit 67 is connected to the interconnected NMOS transistors 10a and 10b.

Each sense amplifier 53 is connected to an input/output line I/O and an inverted input/output line /I/O through each transfer gate 56. The input/output line I/O and the inverted input/output line /I/O form a pair of input/output lines I/O and /I/O. The pair of input/output lines I/O and /I/O are connected to a read amplifier 57. The read amplifier 57 is connected to a data output circuit 58 through a data bus DB and an inverted data bus /DB. The data bus DB and the inverted data bus /DB form a pair of data buses DB and /DB. A precharge circuit 59 is connected to the pair of input/output lines I/O and /I/O.

The levels of the input/output line I/O and the inverted input/output line /I/O complementarily change. The levels of the data bus DB and the inverted data bus /DB complementarily change. The output circuit 58 outputs data.

Each transfer gate 56 is connected to a column decoder 60 through a column selection line CSL. Each transfer gate 56 is formed by a pair of NMOS transistors connected between the pair of input/output lines I/O and /I/O and the sense amplifier 53. The gates of the pair of NMOS transistors are connected to the column decoder 60 through a single column selection line CSL. When the column selection line CSL goes high, therefore, the pair of NMOS transistors are turned on and the transfer gate 56 enters an ON state.

An externally specified column address CA is supplied to the column decoder 60 and an address transition detector (ATD) 62 from a column address buffer 61.

The ATD 62 detects change of the column address CA for detecting external specification of the column address CA, and generates a pulse signal ATD1. In other words, the ATD 62 generates the pulse signal ATD1 every time the column address CA changes. The pulse signal ATD1 is output to a column decoder control circuit 63, a precharge control circuit 64 and a read amplifier control circuit 65.

The precharge control circuit 64 generates a one pulse precharge circuit activation signal PC going high for a previously set time on the basis of fall of the pulse signal ATD1 from a high level to a low level. The activation signal PC is output to the precharge circuit 59.

When activated, the precharge circuit 59 performs precharging for setting the pair of input/output lines I/O and /I/O to the same potential of a prescribed level (e.g., 1/2 Vcc (Vcc: driving voltage for the MRAM).

When receiving the activation signal PC, the precharge circuit 59 is inactivated (enters a standby state for activation) and stops precharging the pair of input/output lines I/O and /I/O. The column decoder control circuit 63 generates a one-pulse column decoder activation signal YS going high for a previously set time on the basis of fall of the pulse signal ATD1 from a high level to a low level. The activation signal YS is output to the column decoder 60.

When receiving the activation signal YS, the column decoder 60 is activated and selects a column (a pair of bit lines BL and /BL) of the memory cell array 51 corresponding to the externally specified column address CA. In other words, the column decoder 60 is activated when receiving the activation signal YS. When activated, the column decoder 60 selects the column selection line CSL corresponding to the externally specified column address CA while converting the column selection line CSL to a high level. Thus, the transfer gate 56 connected to the column selection line CSL enters an ON state. Therefore, the column of the memory cell array 51 corresponding to the externally specified column address CA is selected through the sense amplifier 53 corresponding to the transfer gate 56.

The read amplifier control circuit 65 generates a one-pulse read amplifier activation signal READ by delaying the pulse signal ATD1 by a prescribed time on the basis of fall of the pulse signal ATD1 from a high level to a low level. The timing and the pulse width of the activation signal READ are previously set. The activation signal READ is output to the read amplifier 57.

The delay time for the activation signal READ is so set that the potential difference between the pair of input/output lines I/O and /I/O reaches a level sufficient for reading data. In other words, the delay time is set to a time for waiting for the pair of input/output lines I/O and /I/O changing from the precharged potentials to potentials exhibiting difference sufficient for preventing the read amplifier 57 from erroneous reading.

In other words, the control circuits 63 to 65 are provided with delay circuits and pulse generation circuits for generating the activation signals YS, PC and READ at proper timings and with proper pulse widths in response to the fall of the pulse signal ATD1 from a high level to a low level.

The MRAM is further provided with a read detection circuit 66 detecting the potential difference between the pair of data buses DB and /DB and generating a read detection signal READ on the basis of the result of the detection. When the potential difference between the pair of data bus lines DB and /DB exceeds a prescribed value, therefore, data read from the memory cell 52 is defined and output. Therefore, data outputting (read operation) can be detected by detecting the potential difference between the pair of data bus lines DB and /DB. The read detection circuit 66 detects the read operation on the basis of the potential difference between the pair of data bus lines DB and /DB and generates the high-level read detection signal READ on the basis of the result of the detection. This detection signal READ is output to the column decoder control circuit 63, the precharge control circuit 64 and the read amplifier 65.

Figure 2:
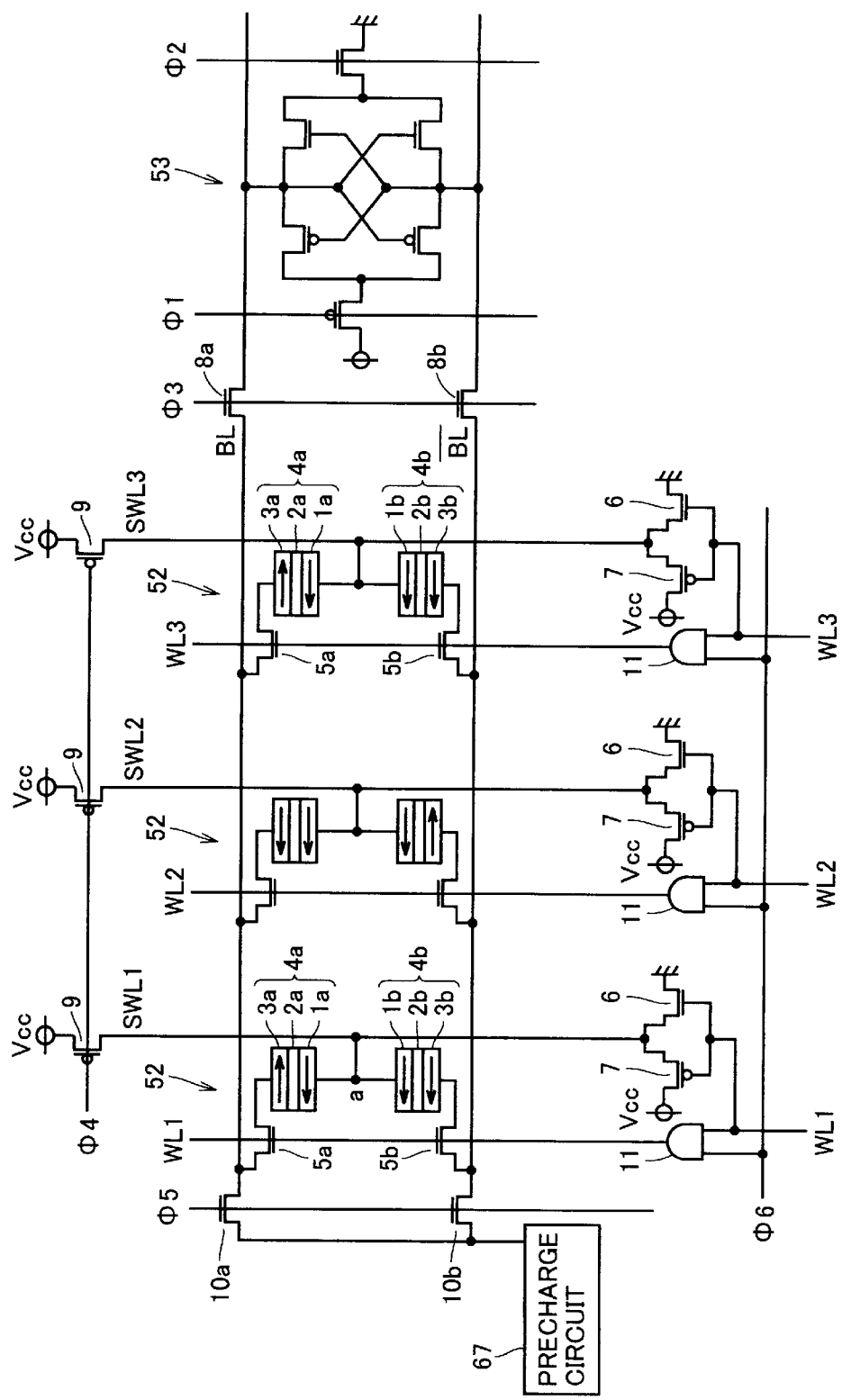
FIG. 2 is a circuit diagram showing the structures of a memory cell part and a sense amplifier part of the MRAM according to the first embodiment shown in FIG. 1.
Figure 4:
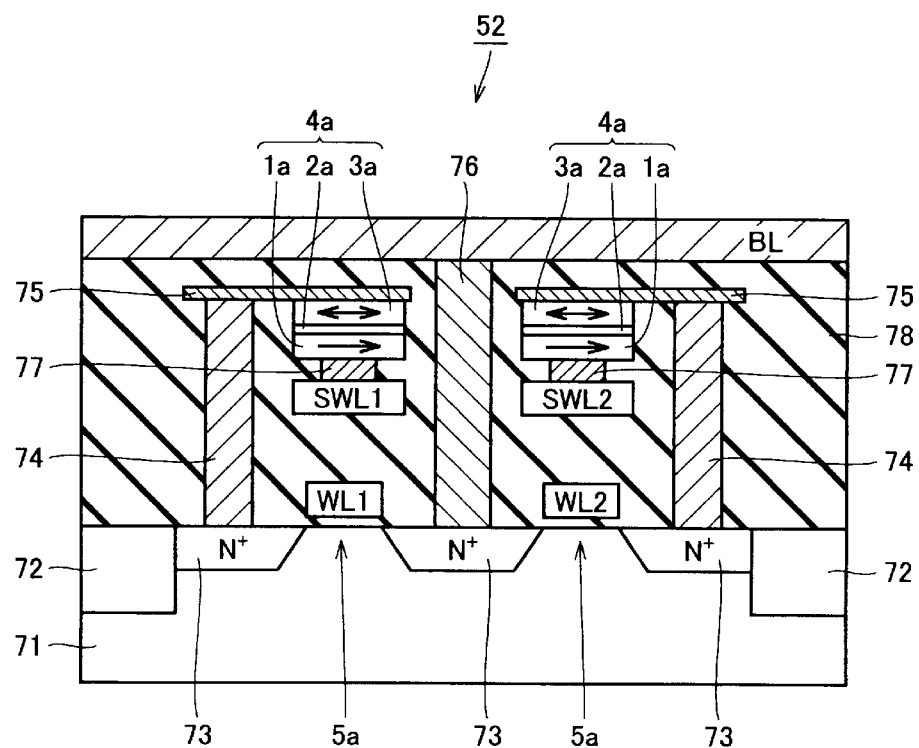
FIG. 4 is a sectional view showing the sectional structure of the memory cell part of the MRAM according to the first embodiment shown in FIGS. 1 and 2.

FIG. 4 is a sectional block diagram showing the memory cell part of the MRAM according to the first embodiment shown in FIGS. 1 and 2. The sectional structure of the memory cell 52 according to the first embodiment is now described with reference to FIG. 4. In the memory cell 52 according to the first embodiment, isolation regions 72 are formed on prescribed regions of a surface of a substrate 71. N-type source/drain regions 73 are formed on an element forming region enclosed with the isolation regions 72 at prescribed intervals. Gate electrodes forming word lines WL1 and WL2 are formed on channel regions located between the adjacent N-type source/drain regions 73. Each gate electrode and each pair of N-type source/drain regions 73 form each NMOS transistor 5a.

The ferromagnetic layers 3a of the TMR elements 4a are connected to the N-type source/drain regions 73 located on both ends through conductive layers 74 and 75. The ferromagnetic layers 3a are easy to invert, and change the directions of magnetization in response to data as shown in FIG. 4. The ferromagnetic layers 1a harder to invert than the ferromagnetic layers 3a are formed on the other surfaces of the ferromagnetic layers 3a through the isolation barrier layers 2a. The ferromagnetic layers 1a are not inverted in response to the data but unidirectionally fixed. Sub-word lines SWL1 and SWL2 are connected to the ferromagnetic layers 1a through conductive layers 77. A bit line BL is connected to the central N-type source/drain region 73 through a conductive layer 76. An interlayer dielectric film 78 is formed between the bit line BL and the substrate 71.

When employing the memory cell 52 having the aforementioned sectional structure, the memory cell 52 of the MRAM according to the first embodiment having the circuit structure shown in FIGS. 1 and 2 can be readily implemented.

Write and read operations of the MRAM having the aforementioned structure are now described.

Write Operation

The write operation is described with reference to a case of writing data in a memory cell 52 connected to the word line WL1. In order to write the data in the MRAM according to the first embodiment, the signal line Φ6 is set to a low level. Thus, a low-level signal is input in the second input terminal of the AND circuit 11. In this case, the word line WL1, selected by the row decoder 54, connected to the first input terminal of the AND circuit 11 is at a high level. Therefore, a part of the selected word line WL1 output from the AND circuit 11 goes low. Thus, the signal line Φ6 is set to a low level thereby forcibly setting the word line WL1 connected to the output terminal of the AND circuit 11 to a low level.

Thus, the NMOS transistors 5a and 5b connected to the word line WL1 connected to the output terminal of the AND circuit 11 enter OFF states. The signal line Φ4 is converted to a low level, thereby turning on the PMOS transistor 9. In this case, the word line WL1 connected to the sub-word line SWL1 through the inverter circuit is at a high level, and hence the NMOS transistor 6 forming the inverter circuit enters an ON state. Thus, a lower part of the sub-word line SWL1 reaches a ground potential. An upper part of the sub-word line SWL1 reaches the power supply potential Vcc since the PMOS transistor 9 is turned on due to the fall of the signal line Φ4, whereby a current flows to the sub-word line SWL1 downward from above.

The selected bit line BL and the selected inverted bit line /BL are set to high and low levels respectively through the pair of input/output lines I/O and /I/O. The signal line Φ5 is raised to a high level, thereby turning on the NMOS transistors 10a an 10b. Thus, the bit line BL and the inverted bit line /BL corresponding thereto are so shorted that a current flows from the high-level bit line BL to the low-level inverted bit line /BL. In other word, a leftward current flows to the bit line BL while a rightward current flows to the inverted bit line /BL.

In order to reverse the directions of the currents flowing to the bit line BL and the inverted bit line /BL, low- and high-level signals are supplied to the bit line BL and the inverted bit line /BL respectively.

As hereinabove described, inverted data ("1" and "0", for example) can be readily written in the ferromagnetic layers 3a and 3b of the TMR elements 4a and 4b of the selected memory cell 52 by feeding a current to the subword line SWL1 downward from above while feeding currents of opposite directions to the pair of bit lines BL and /BL in the selected memory cell 52.

In order to write data ("0" and "1", for example) reverse to the above in the ferromagnetic layers 3a and 3b of the TMR elements 4a and 4b respectively, the directions of the currents fed to the bit line BL and the inverted bit line /BL may be reversed.

In the non-selected memory cells 52, no currents are fed to the sub-word lines SWL, and hence data are not rewritten.

(Read Operation)

In the data write operation, data forming reverse magnetic fields are written in the ferromagnetic layers 3a and 3b of the TMR elements 4a and 4b connected to the bit line BL and the inverted bit line /BL respectively, as hereinabove described. The read operation is now described as to the memory cell 52 connected with the word line WL1 with reference to FIG. 2.

Before rising, the word line WL1 is at a low level. In this case, the PMOS transistor 7 of the inverter circuit connected to the word line WL1 enters an ON state, whereby the potential of the sub-word line SW1 reaches the power supply potential Vcc. Thus, the potential of a node a also reaches the power supply potential Vcc. Further, the potentials of the TMR elements 4a and 4b, which are conductors, also reach the power supply potential Vcc. In this state, the signal line Φ5 is raised to a high level while the precharge circuit 67 precharges the bit line BL and the inverted bit line /BL to the power supply potential Vcc. When the word line WL1 rises, the NMOS transistors 5a and 5b connected to the word line WL1 set to a high level by the row decoder 54 enter ON states. Thus, the bit line BL and the inverted bit line /BL as well as the TMR elements 4a and 4b are rendered conductive. In this state, the potentials of the bit line BL, the inverted bit line /BL and the node a are at the power supply potential Vcc.

When the word line WL1 goes high, further, the signal line Φ5 goes low to disconnect the precharge circuit 67 while the NMOS transistor 6 forming the inverter circuit connected to the word line WL1 enters an ON state, whereby the potential of the sub-word line SWL1 is gradually lowered toward a ground potential GND. Thus, the potential of the node a is also gradually lowered to the ground potential GND. Therefore, the potentials of the bit line BL and the inverted bit line /BL are also gradually lowered to the ground potential GND. The resistance of the TMR element 4a, having the upper and lower ferromagnetic layers 3a and 1a forming magnetic fields in opposite directions, connected to the bit line BL is slightly higher than that of the TMR element 4b connected to the inverted bit line /BL.

When the potentials of the bit line BL and the inverted bit line /BL are started to be lowered toward the ground potential GND, the bit line BL and the inverted bit line /BL and the node a are only slightly different in potential from each other, and hence the MR ratio (rate of resistance change) is maximized.

Figure 3:
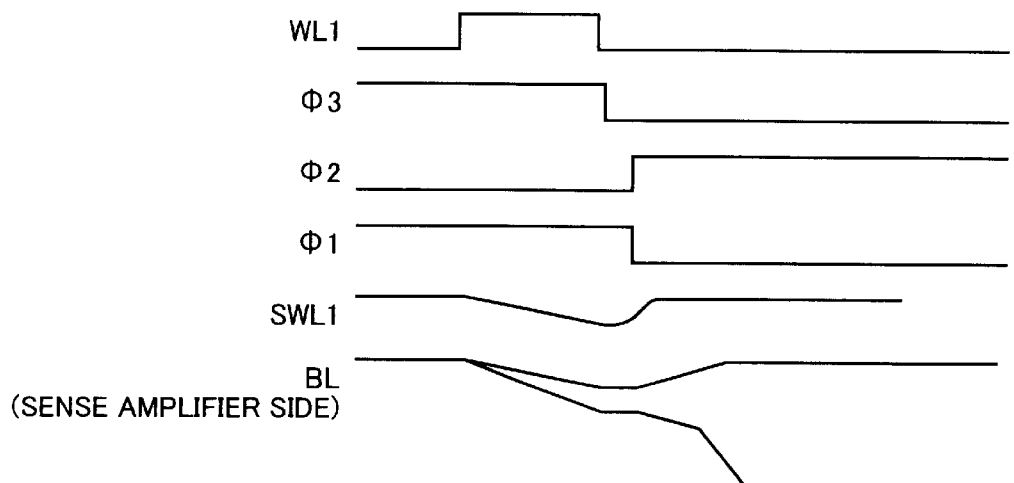
FIG. 3 is an operation waveform diagram for illustrating a read operation of the MRAM according to the first embodiment shown in FIGS. 1 and 2.

As the potential of the node a is lowered, the potentials of the bit line BL and the inverted bit line /BL are also lowered. In this case, the potential of the TMR element 4a, having slightly higher resistance, connected to the bit line BL is lowered more slowly as compared with the inverted bit line /BL. Thus, potential difference is caused between the bit line BL and the inverted bit line /BL. The word line WL1 is lowered from a high level to a low level at the timing of this potential difference, as shown in FIG. 3.

This fall timing of the word line WL1 is set before the potential of the node a reaches the ground potential GND for the following reason: The potential difference between the bit line BL and the inverted bit line /BL is caused only in a transient state. When the potentials of the ferromagnetic layers 1a and 1b (the potential of the node a) of the TMR elements 4a and 4b reach the ground potential GND, therefore, the potentials of the bit line BL and the inverted bit line /BL connected to the ferromagnetic layers 3a and 3b respectively also reach the ground potential GND. In this case, the potential difference between the bit line BL and the inverted bit line /BL disappears to disable detection.

While potential difference is caused between the bit line BL and the inverted bit line /BL at a transient timing, the TMR elements 4a and 4b are conductors and hence the bit line BL and the inverted bit line /BL finally reach the same potential. Therefore, the signal line Φ3 is lowered in response to the fall timing of the word line WL1. Thus, the NMOS transistors (isolation transistors) 8a and 8b enter OFF states, for isolating the bit line BL and the inverted bit line /BL from the sense amplifier 53. Thereafter the signal lines Φ1 and Φ2 of the sense amplifier 53 are raised thereby activating the sense amplifier 53. Thus, the potential difference between the bit line BL and the inverted bit line /BL connected to the sense amplifier 53 is amplified so that the potentials of the bit line BL and the inverted bit line /BL reach the power supply potential Vcc and the ground potential GND respectively. Thus, the data is read.

At the fall timing of the signal line Φ3, the signal line Φ5 is lowered and the precharge circuit 67 is turned on for precharging the bit line BL and the inverted bit line /BL to the power supply potential Vcc.

According to the first embodiment, as hereinabove described, data can be readily read by forming each memory cell 52 by the two TMR elements 4a and 4b and the two NMOS transistors 5a and 5b while detecting the potential difference between the bit line BL and the inverted bit line /BL connected to the two TMR elements 4a and 4b through the sense amplifier 53. Thus, the potential difference is so detected that no value of a small current flowing to the bit line BL may be detected dissimilarly to the conventional memory cell formed by a single TMR element and a single NMOS transistor. Consequently, the sense amplifier 53 may not have a complicated structure for detecting the value of a small current.

According to the first embodiment, further, data stored in the MRAM can be read through the simple sense amplifier 53 similar to that employed in a conventional DRAM by detecting the potential difference between the bit line BL and the inverted bit line /BL through the sense amplifier 53, as hereinabove described. Thus, the data can be read through the simple sense amplifier 53, whereby high-speed reading is enabled as compared with the prior art employing a sense amplifier having a complicated structure.

In the MRAM according to the first embodiment, the structure of the sense amplifier 53, the overall circuit structure and the operating method are similar to those in the conventional DRAM, whereby the technique of the DRAM can be utilized as such. Consequently, replacement from the DRAM is simplified.

Second Embodiment

Figure 5:
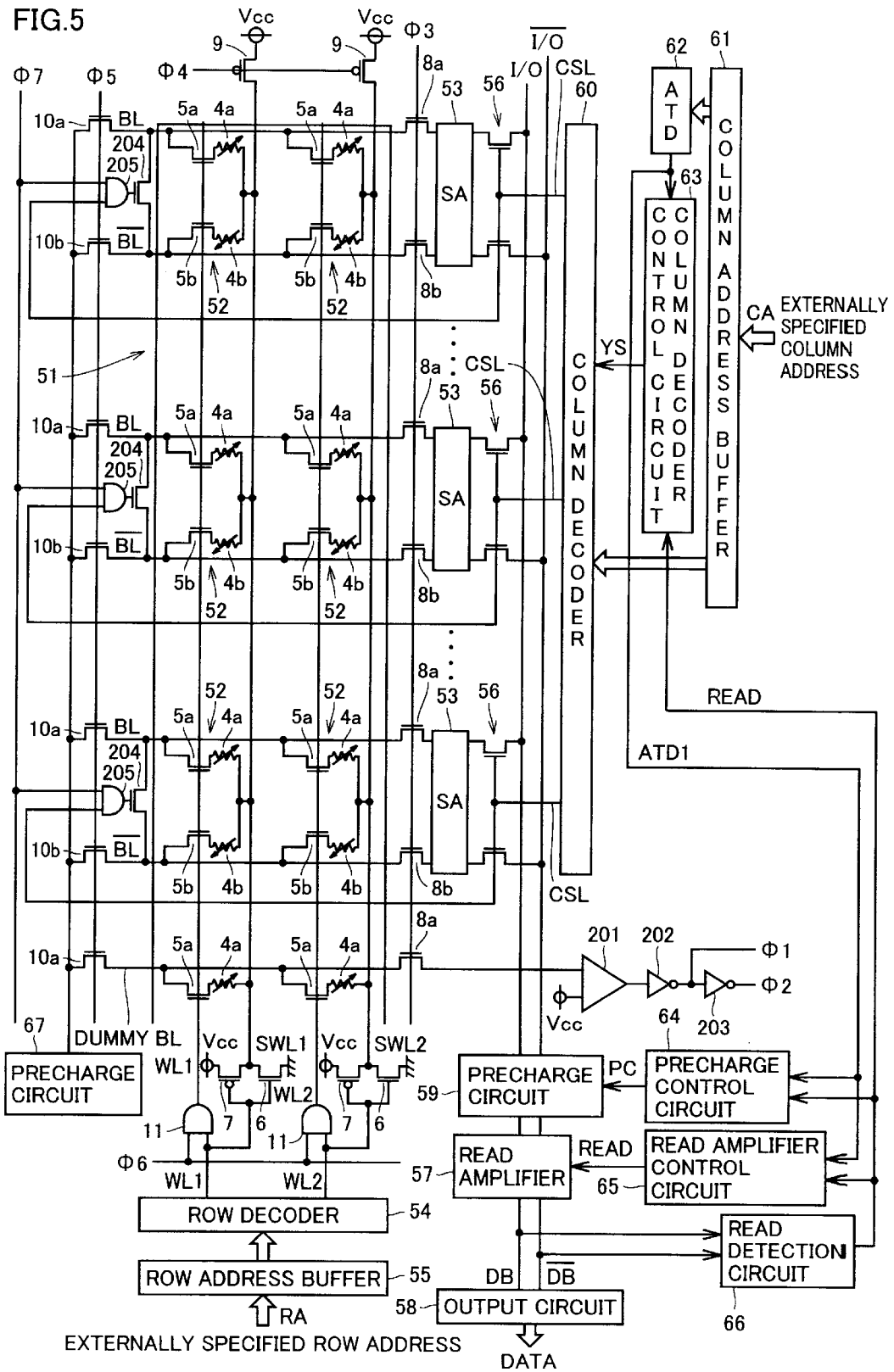
FIG. 5 is a block diagram showing the overall structure of an MRAM according to a second embodiment of the present invention.
Figure 6:
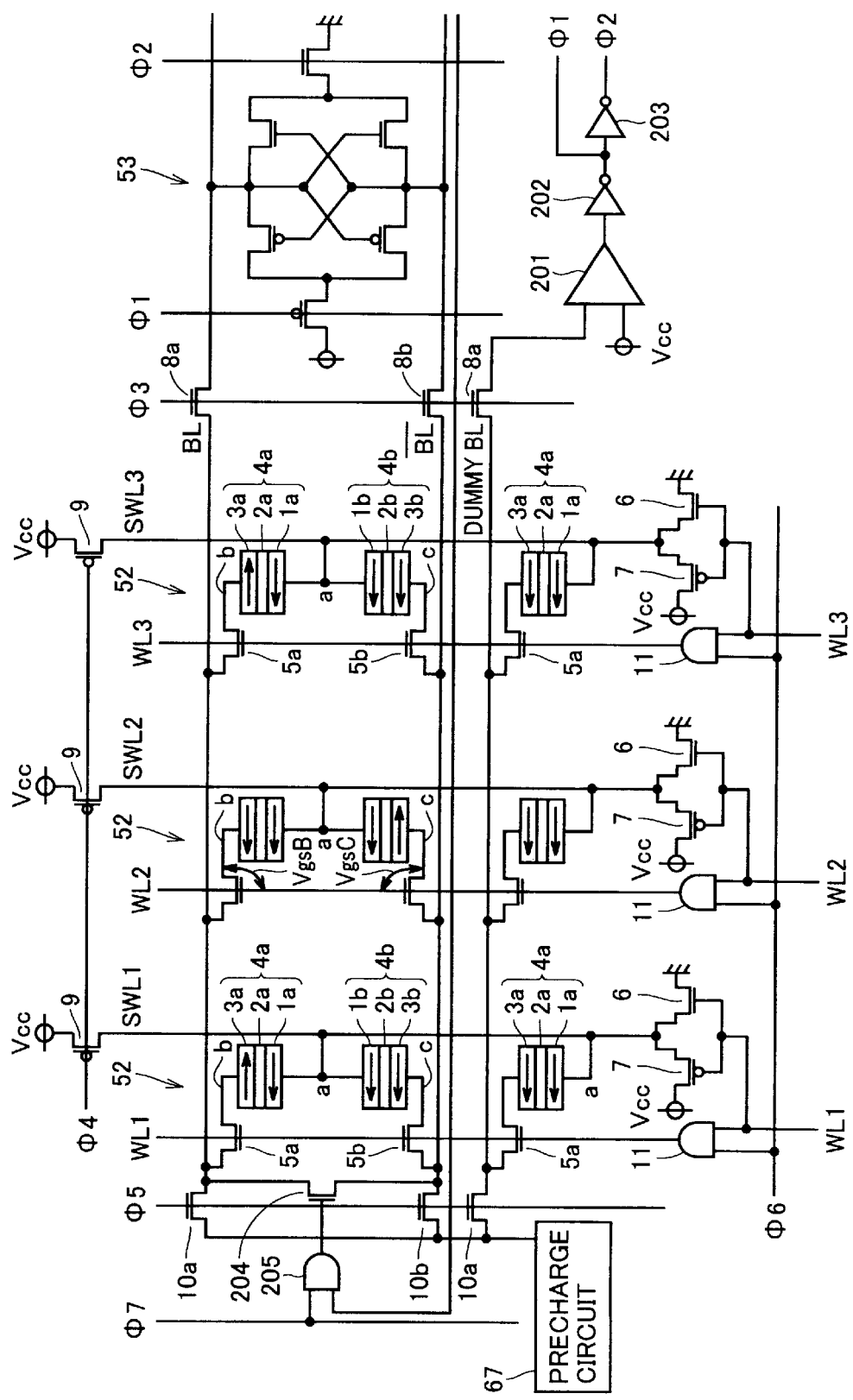
FIG. 6 is a circuit diagram showing the structures of a memory cell part and a sense amplifier part of the MRAM according to the second embodiment shown in FIG. 5.

Referring to FIGS. 5 and 6, an MRAM according to a second embodiment of the present invention is different from the MRAM according to the first embodiment shown in FIGS. 1 and 2 in a point that a dummy bit line (dummy BL) as well as a comparator 201 for detecting the potential of the dummy bit line are provided. The comparator 201 is an example of the "detection circuit" according to the present invention. The second embodiment is now described in detail.

According to the second embodiment, the dummy bit line (dummy BL) similar in structure to a bit line BL is provided as shown in FIGS. 5 and 6. TMR elements 4a are connected to the dummy bit line through transistors 5a. All TMR elements 4a connected to the dummy bit line are so set that ferromagnetic layers 1a an 3a have the same (parallel) directions of magnetization. The dummy bit line is connected to a first input end of the comparator 201. A reference voltage Vcc is connected to a second input end of the comparator 201. An inverter 202 is connected to an output of the comparator 201, while another inverter 203 is connected to an output of the inverter 202. The output of the inverter 202 is employed as a signal Φ1, while the output of the inverter 203 is employed as a signal Φ2. The signals Φ1 and Φ2 are employed as activation signals for sense amplifiers 53.

Figure 7:
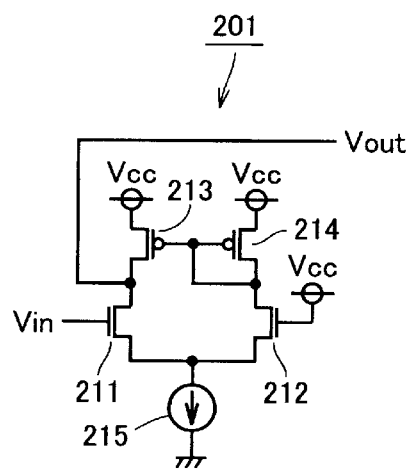
FIG. 7 is a circuit diagram showing the internal structure of a comparator shown in FIGS. 5 and 6.

As shown in FIG. 7, the comparator 201 includes a pair of PMOS transistors 213 and 214, an NMOS transistor 211 having a gate receiving an input voltage (the voltage of the dummy bit line) Vin and an NMOS transistor 212 having a gate receiving the reference voltage Vcc. The NMOS transistor 211 is an example of the "first transistor" according to the present invention, and the NMOS transistor 212 is an example of the "second transistor" according to the present invention. A constant current source 215 is connected to first terminals of the NMOS transistors 211 and 212. The reference voltage Vcc is connected to first terminals of the PMOS transistors 213 and 214. A node between second terminals of the PMOS transistor 213 and the NMOS transistor 211 outputs an output voltage Vout.

The comparator 201 according to the second embodiment shown in FIG. 7 is so structured that the quantity of a current flowing to the NMOS transistor 211 receiving the input voltage Vin is larger than that of a current flowing to the NMOS transistor 212 receiving the reference voltage Vcc. More specifically, the gate width of the NMOS transistor 211 is rendered slightly larger than that of the NMOS transistor 212, thereby increasing the quantity of the current flowing to the NMOS transistor 211 beyond that of the current flowing to the NMOS transistor 211. It is also possible to increase the quantity of the current flowing to the NMOS transistor 211 beyond that of the current flowing to the NMOS transistor 212 by reducing the gate length of the NMOS transistor 211 slightly below that of the NMOS transistor 211 without changing the gate widths.

Thus, the quantity of the current flowing to the MOS transistor 211 receiving the input voltage Vin is rendered larger than that of the current flowing to the NMOS transistor 212 receiving the reference voltage Vcc, so that a low-level signal can be output as the output voltage Vout also when the input voltage Vin is identical to the reference voltage Vcc. Thus, the output of the comparator 201 can be prevented from being undefined when the input voltage Vin for the comparator 201 is identical to the reference voltage Vcc. In other words, the comparator 201 according to the second embodiment outputs a low-level signal when the input voltage Vin is identical to the reference voltage Vcc, while outputting a high level signal when the input voltage Vin is lower than the reference voltage Vcc.

According to the second embodiment, a signal Φ7 and an output of a column decoder 60 are input in an AND circuit 205, as shown in FIGS. 5 and 6. An output of the AND circuit 205 is connected to the gate of a transistor 204 for connecting the bit line BL with an inverted bit line /BL. According to this structure, only a selected bit line BL and the inverted bit line /BL corresponding thereto can be readily shorted.

Read and write operations of the MRAM according to the second embodiment having the aforementioned structure are now described.

Read Operation

Figure 8:
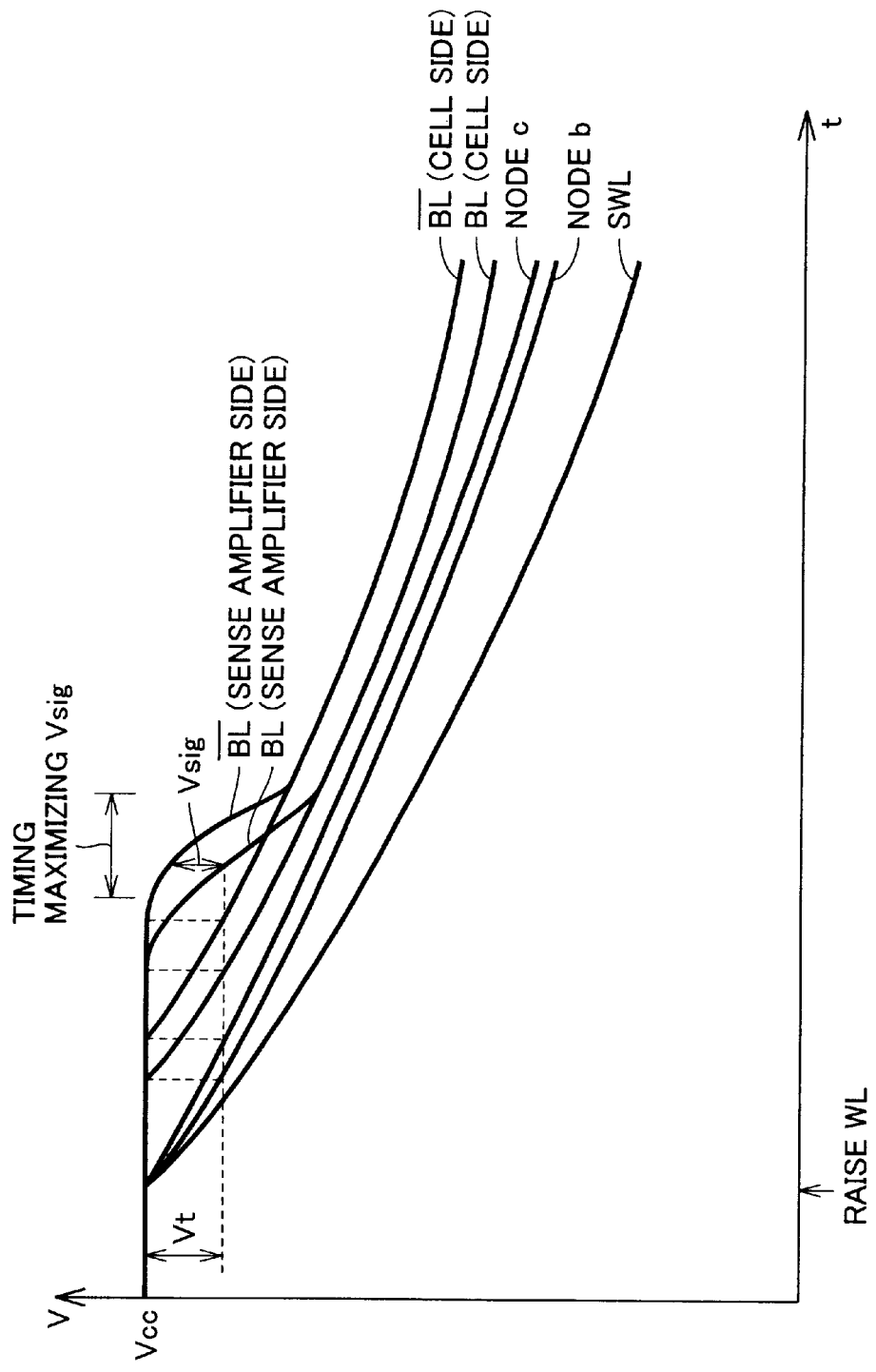
FIG. 8 is an operation waveform conceptual diagram for illustrating a read operation of the MRAM according to the second embodiment.
Figure 9:
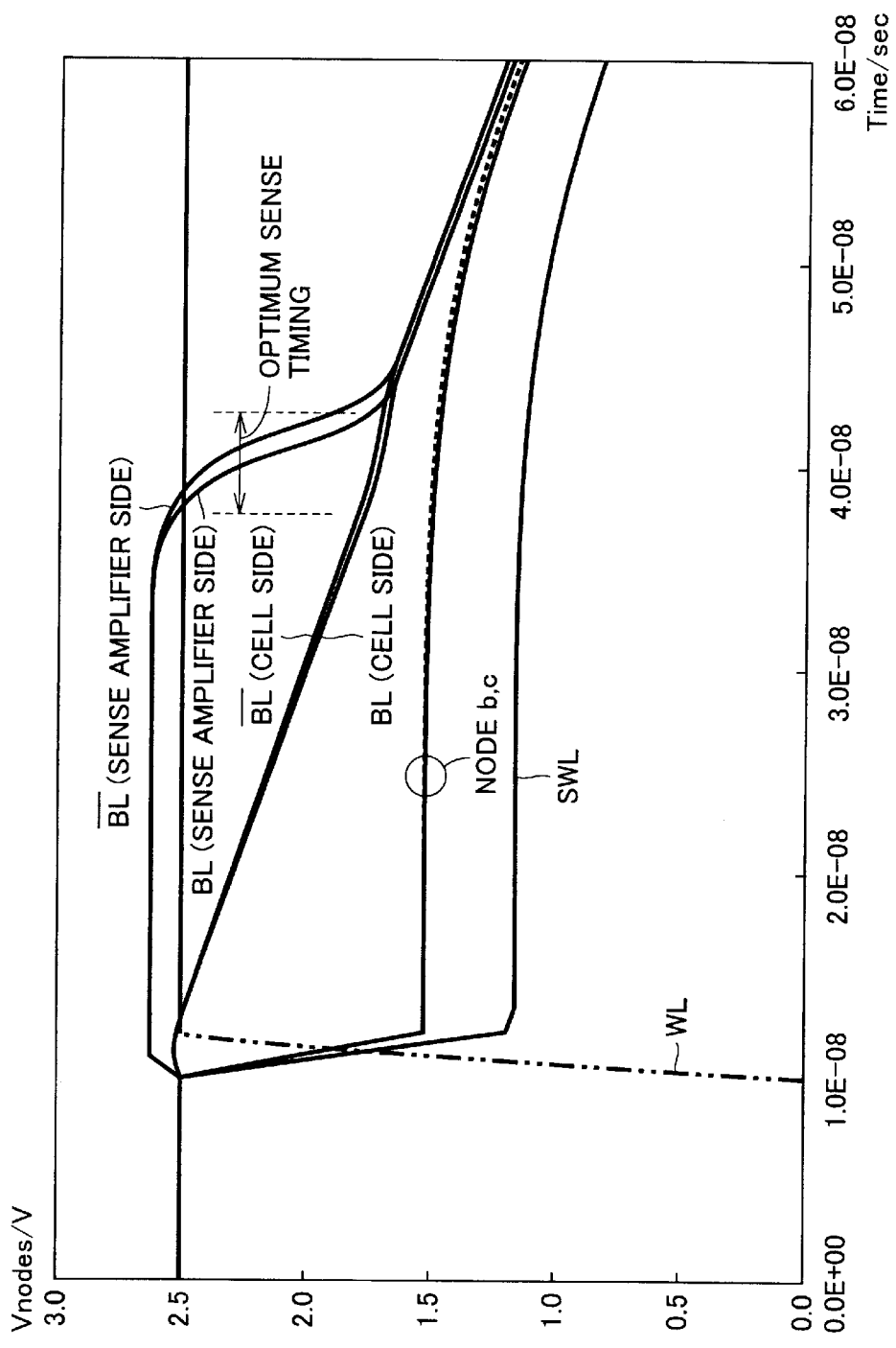
FIGS. 9 and 10 are operation waveform simulation diagrams for illustrating the read operation of the MRAM according to the second embodiment.
Figure 10:
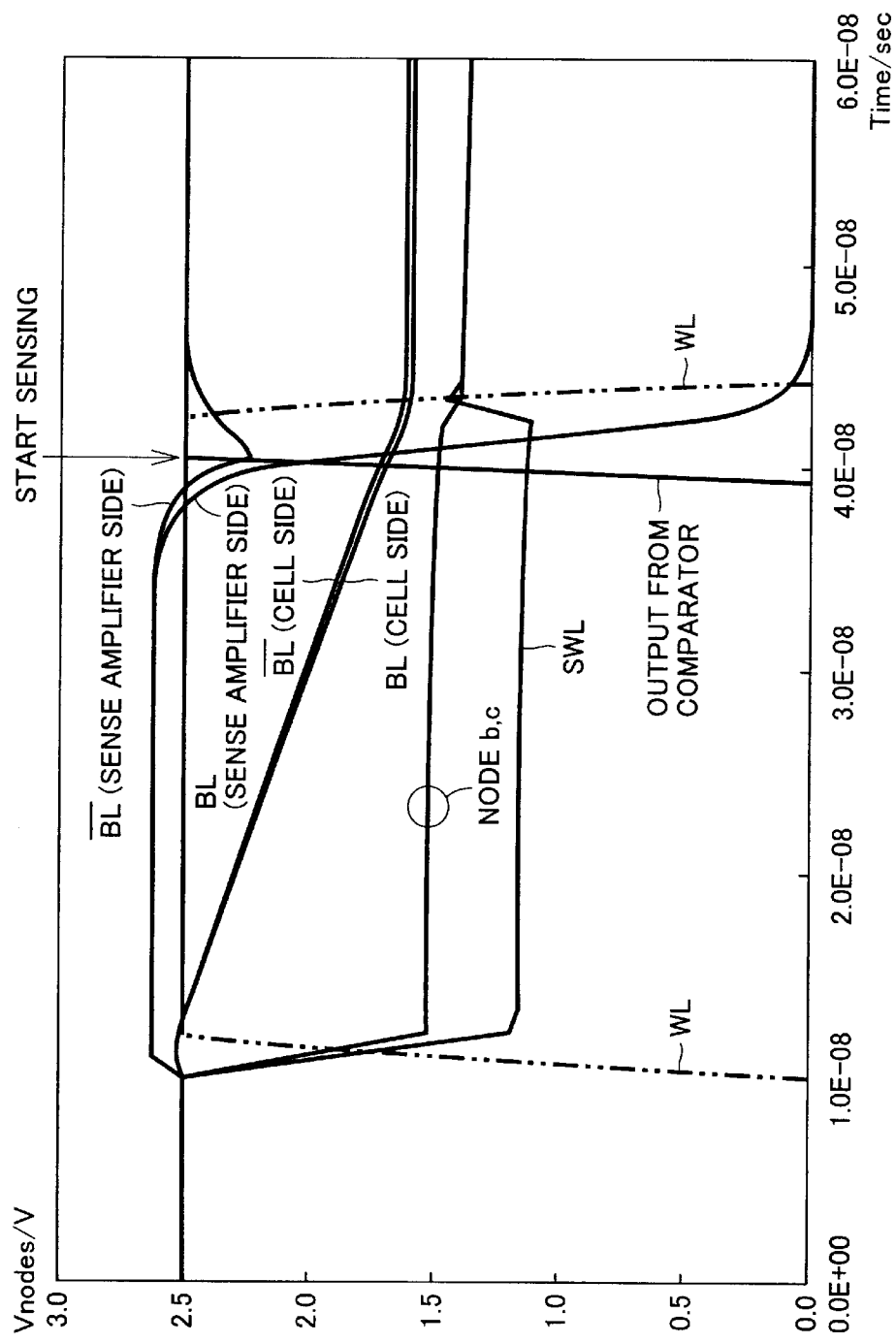

FIG. 8 is an operation waveform conceptual diagram for illustrating the read operation of the MRAM according to the second embodiment of the present invention. FIGS. 9 and 10 are operation waveform simulation diagrams for illustrating the read operation of the MRAM according to the second embodiment. The read operation according to the second embodiment is described with reference to such a case that the resistance of the TMR element 4a connected to the bit line BL is lower than that of the TMR element 4b connected to the inverted bit line /BL. In other words, the TMR element 4a is magnetized in the same direction (parallel) and the TMR element 4b is magnetized in opposite directions (antiparallel) as in the memory cell 52 connected to a word line WL2 shown in FIG. 6. The read operation is now described on the assumption that the word line WL2 is selected.

Referring to FIG. 6, the word line WL2 is at a low level in an initial state before rising. In this case, a PMOS transistor 7 of an inverter circuit connected to the word line WL2 enters an ON state, whereby the potential of a sub-word line SWL2 reaches the reference voltage Vcc. Thus, the potential of a node a also reaches the reference voltage Vcc. The potentials of the TMR elements 4a and 4b, which are conductors, also reach the reference voltage Vcc. In this case, a signal Φ5 is raised to a high level while a precharge circuit 67 precharges the bit line BL and the inverted bit line /BL as well as the dummy bit line to the reference voltage Vcc.

When the word line WL2 goes high, NMOS transistors 5a and 5b connected to the word line WL2 enter ON states. Thus, the bit line BL and the inverted bit line /BL as well as the TMR elements 4a and 4b are rendered conductive. In this state, the potentials of the bit line BL, the inverted bit line /BL, the dummy bit line (dummy BL), the node a and nodes b and c are at the reference voltage Vcc.

Before the word line WL2 goes high, the signal Φ5 goes low to disconnect the precharge circuit 67 while an NMOS transistor 6 of the inverter circuit connected to the word line WL2 enters an ON state, whereby the potential of the sub-word line SWL2 is gradually lowered toward a ground potential GND. Thus, the potential of the node a is also gradually reduced toward the ground potential GND. Therefore, the potentials of the bit line BL and the inverted bit line /BL are also gradually reduced to the ground potential GND.

FIG. 8 shows waveforms in the case of raising the word line WL and gradually lowering the sub-word line SWL. As shown in FIG. 8, the word line WL rises and the subword line SWL gradually falls so that the nodes b and c (see FIG. 6) fall. At this time, the TMR element 4a having the same direction (parallel) of magnetization and the TMR element 4b having opposite directions (antiparallel) of magnetization exhibit different resistance values, to cause potential difference between the nodes b and c. The bit line BL and the inverted bit line /BL on a cell side (on the side of the memory cell 52) start to fall when the potentials of the nodes b and c are reduced below Vcc-Vt (threshold voltage). In this case, the potential of the TMR element 4a having the parallel direction of magnetization and exhibiting lower resistance starts to lower in advance of that of the TMR element 4b having antiparallel directions of magnetization and exhibiting higher resistance.

On-state resistance of the transistors 5a and 5b connected to the bit line BL and the inverted bit line /BL on the cell side depend on gate-to-source potential difference VgsB and VgsC (see FIG. 6) of the transistors 5a and 5b. In this case, the potentials of the nodes b and c are different from each other, and hence the gate-to-source potential difference VgsB of the transistor 5a is different from the gate-to-source potential difference VgsC of the transistor 5b. Therefore, the transistor 5a connected to the TMR element 4a having lower resistance (parallel direction of magnetization) is increased in potential difference Vgs and reduced in resistance. Therefore, the potential difference between the bit line BL and the inverted bit line /BL on the cell side exceeds the potential difference between the nodes b and c. Similarly, the potential difference (Vsig) between a bit line BL and an inverted bit line /BL on the side of the sense amplifier 53 is increased due to influence by potential difference Vgs of isolation NMOS transistors 8a and 8b.

However, wiring capacities of the bit line BL and the inverted bit line /BL on the side of the sense amplifier 53 are smaller than those of the bit line BL and the inverted bit line /BL on the cell side, and hence the bit line BL and the inverted bit line /BL on the side of the sense amplifier 53 reach the same potentials as the bit line BL and the inverted bit line /BL on the cell side. Therefore, potential difference input across the sense amplifier 53 can be set large from a timing when the potentials of the bit line BL and the inverted bit line /BL on the side of the sense amplifier 53 start to lower from the reference voltage Vcc to a timing when the same reach the same potentials as the bit line BL and the inverted bit line /BL on the cell side.

In the aforementioned first embodiment, the sense amplifier 53 starts detection at an arbitrary timing before the potentials of the bit line BL and the inverted bit line /BL on the cell side reach 0 V. In this case, there is a possibility of missing a timing efficient for detection.

According to the second embodiment, therefore, the dummy bit line (dummy BL) and the comparator 201 for detecting the potential of the dummy bit line are provided thereby detecting the fall timing of the bit line BL on the side of the sense amplifier 53. The bit line BL and the inverted bit line /BL on the cell side are isolated from the bit line BL and the inverted bit line /BL on the side of the sense amplifier 53 at this timing for operating the sense amplifier 53.

More specifically, the potentials of the bit line BL and the inverted bit line /BL, the dummy bit line (dummy BL) and the sub-word line SWL2 are at the reference voltage Vcc in an initial state, as described above. Thereafter the word line WL2 rises while the sub-word line SWL starts to gradually fall. Thus, potential difference is caused between the bit line BL and the inverted bit line /BL on the cell side. When the potentials of the bit line BL and the inverted bit line /BL on the cell side thereafter fall below Vcc-Vt, the potentials of the bit line BL and the inverted bit line /BL on the side of the sense amplifier 53 start to fall from the reference voltage Vcc, as shown in FIG. 8. The potential of the dummy bit line (on the side of the comparator 201) also starts to lower at this timing. In this case, the TMR element 4a connected to the dummy bit line is set in the state of the parallel direction of magnetization with low resistance, and hence the potential of the dummy bit line starts to lower at the same timing as either the bit line BL or the inverted bit line /BL (the bit line BL in the second embodiment) having lower resistance.

In the initial state, an input Vin of the comparator 201 connected with the dummy bit line is identical to the reference voltage Vcc. When the input Vin of the comparator 201 is identical to the reference voltage Vcc as described above, a low-level signal is output as an output Vout in the second embodiment. When the potential of the dummy bit line (on the side of the comparator 201) starts to lower from the reference voltage Vcc to reach a lower level, the comparator 201 at the level of the reference voltage Vcc outputs a high-level signal. In response to this signal, the signal Φ2 goes high and the signal Φ1 goes low. Thus, the sense amplifier 53 is activated. Further, the signal Φ3 falls at this timing. Thus, the isolation NMOS transistors 8a and 8b enter OFF states, thereby isolating the bit line BL and the inverted bit line /BL on the cell side from the bit line BL and the inverted bit line /BL on the side of the sense amplifier 53.

Thereafter the potentials of the bit line BL and the inverted bit line /BL on the side of the sense amplifier 53 are amplified and read similarly to sensing of a DRAM. The bit line BL and the inverted bit line /BL on the cell side return to the initial state due to the signal Φ5 going high.

FIGS. 9 and 10 show actual simulation waveforms. FIG. 9 shows waveforms obtained by observing only the behavior of the bit lines BL without starting sensing by the sense amplifier 53. FIG. 10 shows waveforms obtained by operating the sense amplifier 53 by driving the comparator 201.

Write Operation

The write operation according to the second embodiment is basically identical to the aforementioned write operation according to the first embodiment, and hence redundant description is not repeated. According to the second embodiment, the signal Φ7 and the output of the column decoder 60 are input in the AND circuit 205 while the output of the AND circuit 205 is connected to the gate of the transistor 204 for connecting the bit line BL and the inverted bit line /BL, as described above. Thus, only the selected bit line BL and the inverted bit line /BL corresponding thereto can be readily shorted in the write operation.

According to the second embodiment, as hereinabove described, the fall timing of the bit line BL on the side of the sense amplifier 53 can be detected through the dummy bit line and the comparator 201. Further, the sense amplifier 53 can readily detect the potential difference (Vsig) between the bit line BL and the inverted bit line /BL on the side of the sense amplifier 53 by turning off the isolation NMOS transistors 8a and 8b and activating the sense amplifier 53 at the fall timing of the dummy bit line detected by the comparator 201.

Third Embodiment

Figure 11:
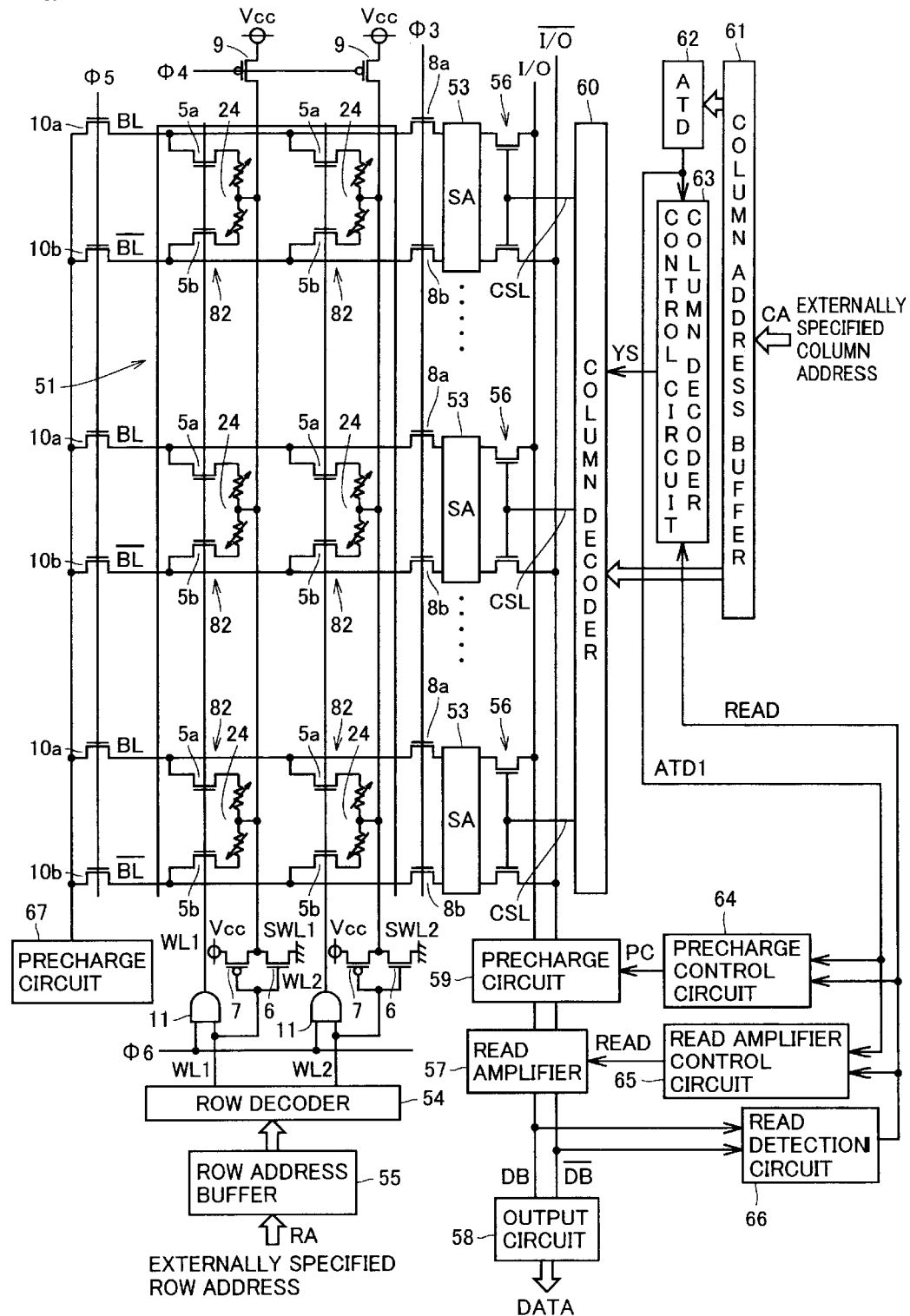
FIG. 11 is a block diagram showing the overall structure of an MRAM according to a third embodiment of the present invention.
Figure 12:
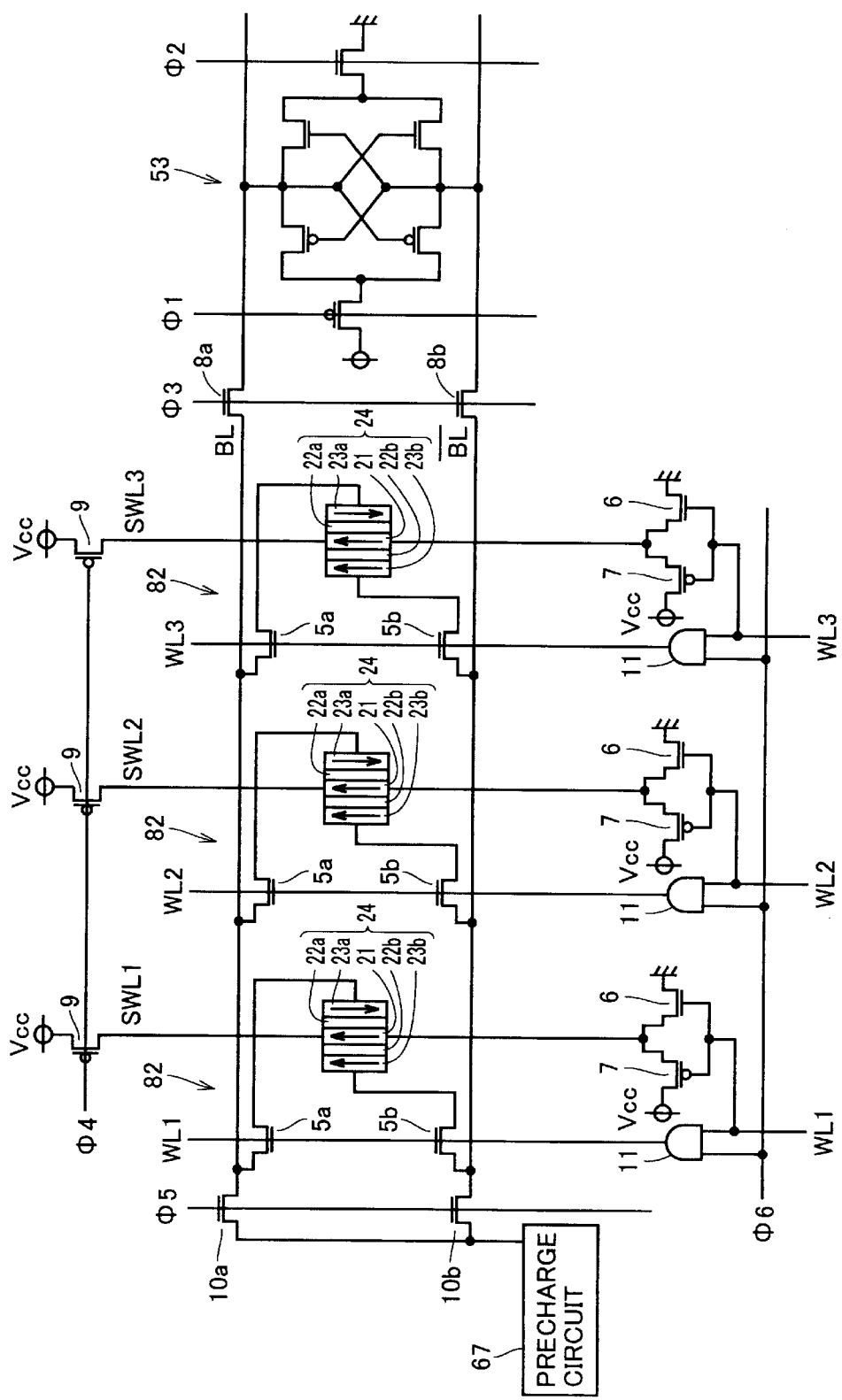
FIG. 12 is a circuit diagram showing the structures of a memory cell part and a sense amplifier part of the MRAM according to the third embodiment shown in FIG. 11.

Referring to FIGS. 11 and 12, an MRAM according to a third embodiment of the present invention is different from the MRAM according to the first embodiment shown in FIGS. 1 and 2 only in a memory cell part. In the MRAM according to the third embodiment, each memory cell 82 is formed by a double junction TMR element 24 and two NMOS transistors 5a and 5b. The circuit structure of the third embodiment is similar to that of the first embodiment except the memory cell part.

As shown in FIG. 12, the double junction TMR element 24 according to the third embodiment includes a ferromagnetic layer 23a, an isolation barrier layer 22a, another ferromagnetic layer 23b, another isolation barrier layer 22b and still another ferromagnetic layer 21 harder to invert than the ferromagnetic layers 23a and 23b. In other words, the ferromagnetic layers 23a and 23b are formed on both surfaces of the central ferromagnetic layer 21, which is harder to invert, through the isolation barrier layers 22a and 22b respectively.

In the double junction TMR element 24 according to the third embodiment, the ferromagnetic layer 21 shown in FIG. 12 share the ferromagnetic layers 1a and 1b of the TMR elements 4a and 4b according to the first embodiment shown in FIG. 2. Thus, the double junction TMR element 24 according to the third embodiment can have the same functions as the two TMR elements 4a and 4b according to the first embodiment.

The double junction TMR element 24 is an example of the "storage element exhibiting a ferromagnetic tunnel effect" according to the present invention. The ferromagnetic layer 23a is an example of the "first magnetic layer" according to the present invention, the ferromagnetic layer 21 is an example of the "second magnetic layer" according to the present invention, an the ferromagnetic layer 23b is an example of the "third magnetic layer" according to the present invention. The isolation barrier layer 22a is an example of the "first isolation barrier layer" according to the present invention, and the isolation barrier layer 22b is an example of the "second isolation barrier layer" according to the present invention.

In the third embodiment, the double junction TMR element 24 simply substitutes for the two TMR elements 4a and 4b according to the first embodiment as described above, while the remaining circuit structure is similar to that of the first embodiment. Therefore, write and read operations of the MRAM according to the third embodiment are also similar to those of the MRAM according to the first embodiment. Therefore, redundant description is not repeated.

According to the third embodiment, as hereinabove described, each memory cell 82 is formed by the double junction TMR element 24 including the ferromagnetic layers 21, 23a and 23b and the isolation barrier layers 22a and 22b and two NMOS transistors 5a and 5b, whereby the area of the memory cell 82 can be reduced as compared with the memory cell 52 according to the first embodiment formed by the two TMR elements 4a and 4b and the two NMOS transistors 5a and 5b.

Further, the MRAM according to the third embodiment, performing a read operation similar to that of the MRAM according to the first embodiment, can attain an effect similar to that of the first embodiment. In other words, data can be readily read by detecting potential difference between a bit line BL and an inverted bit line /BL connected to the double TMR element 24 through a sense amplifier 53 (see FIG. 12). Thus, no value of a small current flowing to the bit line BL may be detected dissimilarly to the conventional memory cell formed by a single TMR element and a single NMOS transistor. Consequently, the sense amplifier 53 may not have a complicated structure for detecting the value of a small current.

The MRAM according to the third embodiment is so structured as to detect the potential difference between the bit line BL and the inverted bit line /BL through the sense amplifier 53 (see FIG. 12) similarly to the aforementioned first embodiment, whereby data stored in the MRAM can be read through the simple sense amplifier 53 similar to that employed for a conventional DRAM. Thus, data can be read through the simple sense amplifier 53, whereby high-speed reading is enabled as compared with the prior art employing a sense amplifier having a complicated structure.

In the MRAM according to the third embodiment, the structure of the sense amplifier 53, the overall circuit structure and an operating method are similar to those of the conventional DRAM similarly to the first embodiment, whereby the technique of the DRAM can be utilized as such. Consequently, replacement from a DRAM is simplified. Further, data can be readily detected also when the double junction TMR element 24 has high resistance by reading the potential difference caused between the bit line BL and the inverted bit line /BL by inputting a pulse signal in a selected word line through the sense amplifier 53 (FIG. 12), dissimilarly to the conventional case of reading the value of a small current.

Figure 13:
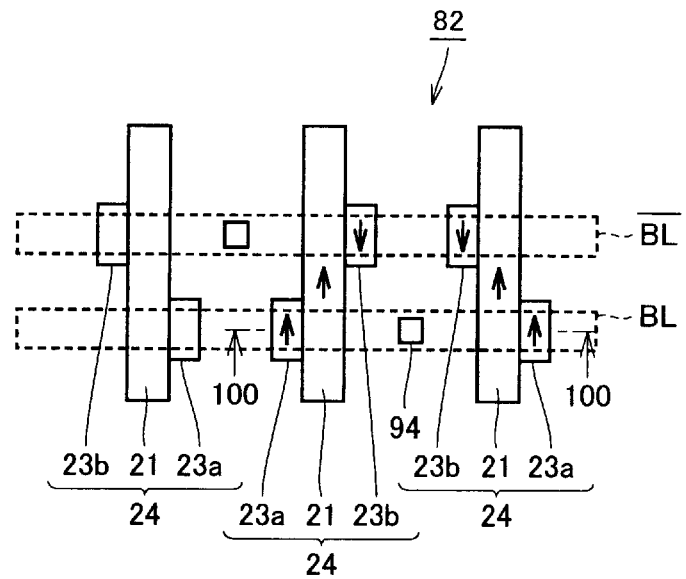
FIG. 13 is a plane layout diagram of the memory cell part of the MRAM according to the third embodiment shown in FIGS. 11 and 12.
Figure 14:
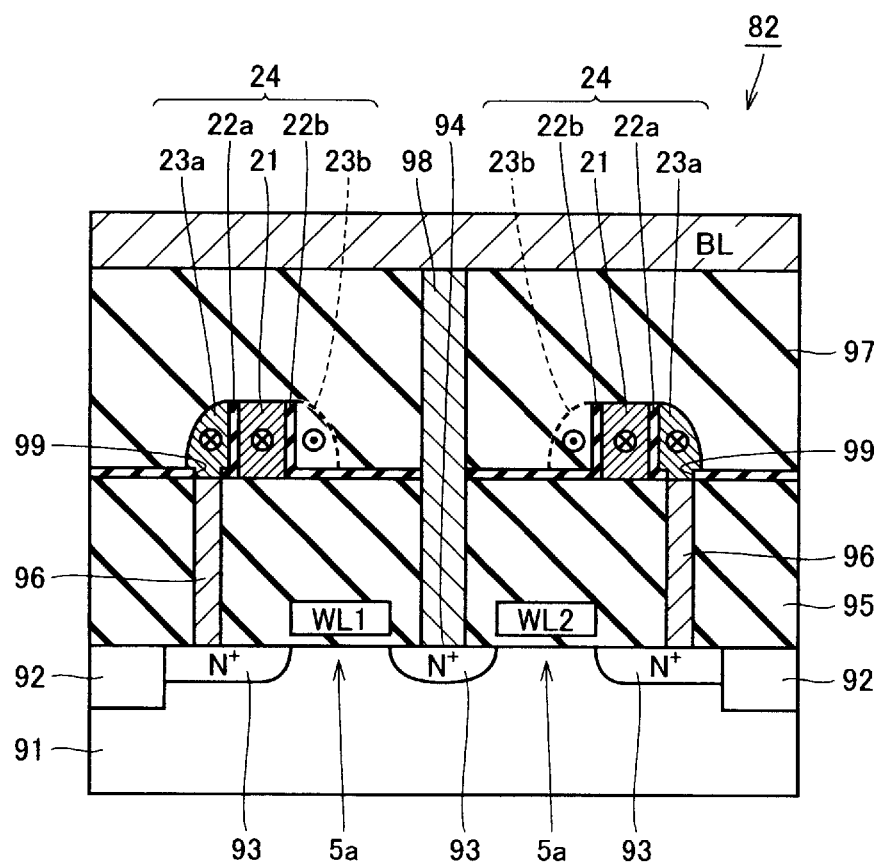
FIG. 14 is a sectional view of the MRAM according to the third embodiment taken along the line 100—100 in FIG. 14.

FIG. 13 is a plane layout diagram for implementing the circuit structure of the MRAM according to the third embodiment shown in FIGS. 11 and 12, and FIG. 14 is a sectional view taken along the line 100—100 in FIG. 13. The structure of the memory cell 82 of the MRAM according to the third embodiment is now described with reference to FIGS. 13 and 14.

The plane layout diagram of FIG. 13 shows only the bit line BL and the inverted bit line /BL, the ferromagnetic layers 21, 23a and 23b forming the double junction TMR element 24 and a bit line contact part 94, in order to simplify the illustration.

In the sectional structure of the memory cell 82 of the MRAM according to the third embodiment, isolation regions 92 are formed on prescribed regions of a surface of a substrate 91, as shown in FIG. 14. N-type source/drain regions 93 are formed on an element forming region enclosed with the isolation regions 92 at prescribed intervals. Gate electrodes forming word lines WL1 and WL2 are formed on channel regions located between the adjacent N-type source/drain regions 93.

The readily inverted sidewall-shaped ferromagnetic layers 23a of the double junction TMR elements 24 are connected to the N-type source/drain regions 93 located on both ends through conductive layers 96. In this case, the conductive layers 96 and the ferromagnetic layers 23a are connected with each other through contact holes 99. In order to prevent the conductive layers 96 and the ferromagnetic layers 23a from reacting with each other, barrier films (not shown) may be formed between the conductive layers 96 and the ferromagnetic layers 23a. The hardly inverted ferromagnetic layers 21 are formed on side surfaces of the ferromagnetic layers 23a through the isolation barrier layers 22a. The readily inverted sidewall-shaped ferromagnetic layer 23b are formed on other side surfaces of the ferromagnetic layers 21 through the isolation barrier layers 22b.

The ferromagnetic layers 23a and 23b of the double junction TMR elements 24 are formed in a staggered manner with respect to the central ferromagnetic layers 21, as shown in FIG. 13.

The bit line BL is connected to the bit line contact part 94 located on the surface of the central N-type source/drain region 93 through a conductive layer 98. Interlayer dielectric films 95 and 97 are formed to cover the overall surface.

Figure 15:
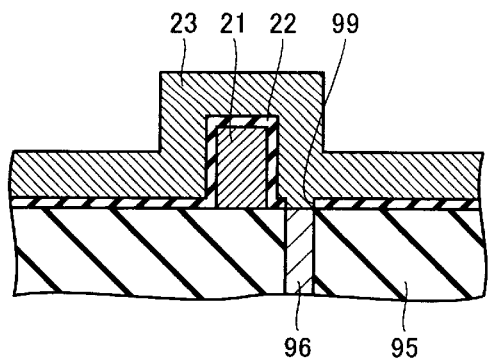
FIG. 15 is a sectional view illustrating a process of fabricating the double junction TMR element part shown in FIG. 14.
Figure 16:
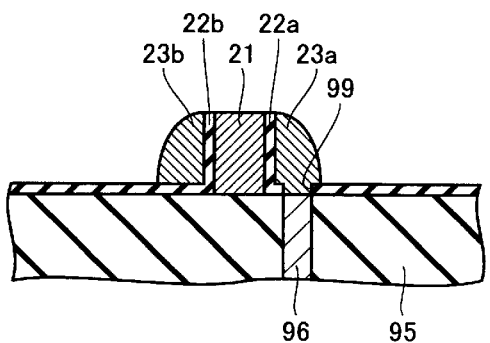
FIG. 16 is a sectional view for illustrating a process of fabricating a double junction TMR element of the memory cell part shown in FIG. 14.
Figure 17:
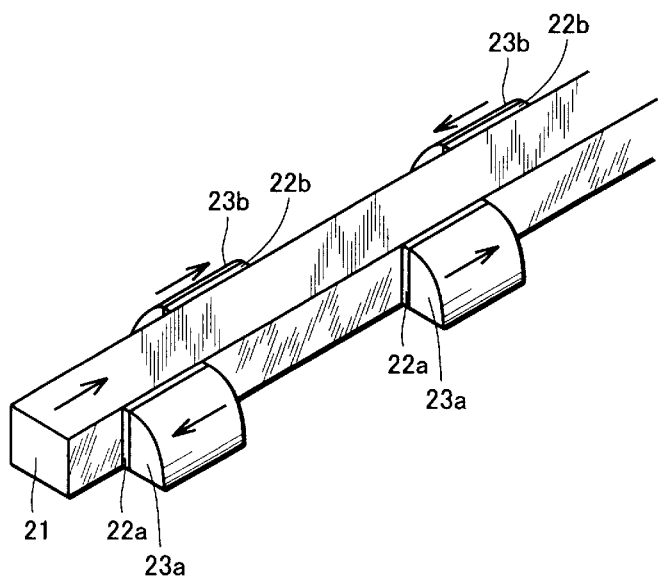
FIG. 17 is a perspective view for illustrating the process of fabricating the double junction TMR element according to the third embodiment shown in FIG. 14.
Figure 18:
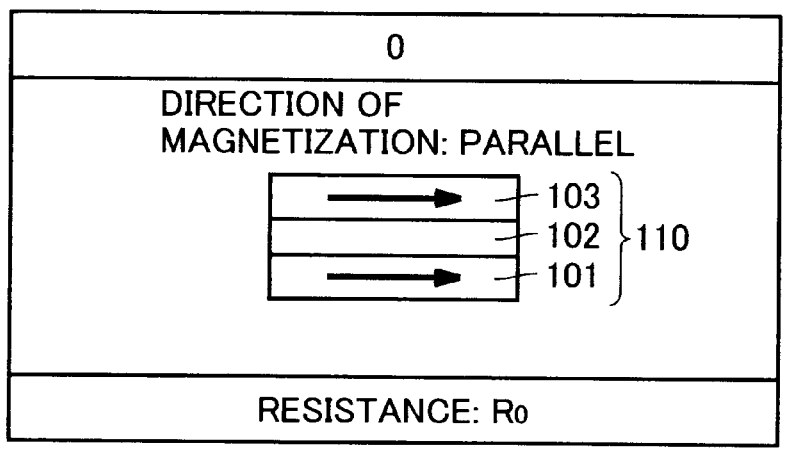
FIGS. 18 and 19 are schematic diagrams for illustrating the structure of a storage element of a conventional MRAM.
Figure 19:
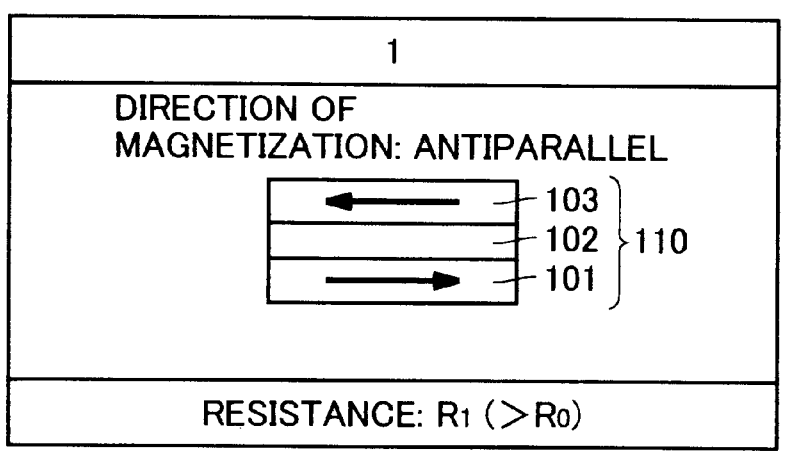
Figure 20:
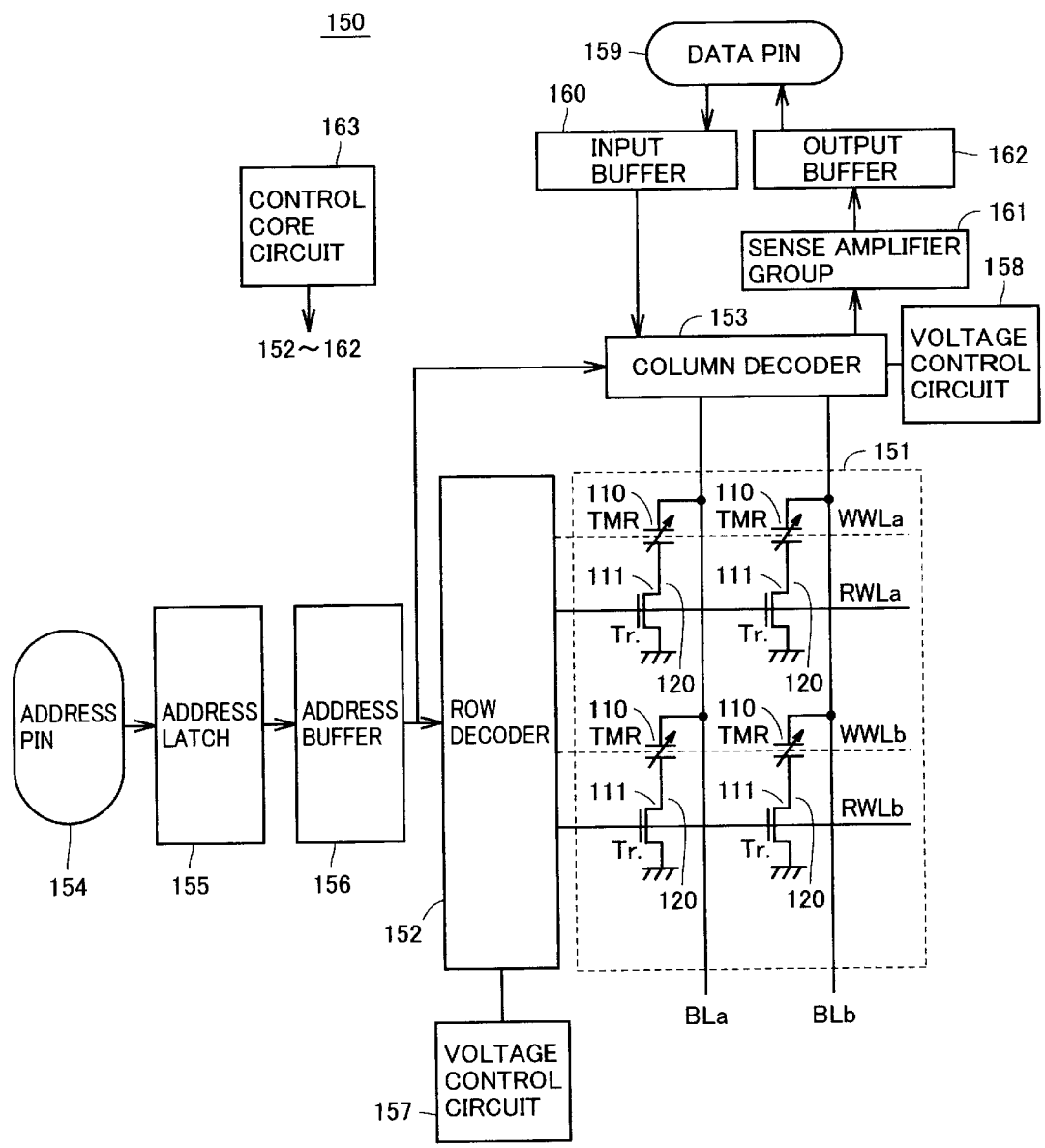
FIG. 20 is a block diagram showing the overall structure of the conventional MRAM.

FIGS. 15 to 17 are sectional views and a perspective view for illustrating a process of fabricating the double junction TMR element part shown in FIGS. 13 and 14. The fabrication process for the double junction TMR element part is now described with reference to FIGS. 15 to 17.

First, the ferromagnetic layer 21 patterned in a prescribed shape is formed on the interlayer dielectric film 95, as shown in FIG. 15.

An alumina layer 22 is formed as an isolation barrier material layer to cover the ferromagnetic layer 21 and the interlayer dielectric film 95, and thereafter the contact hole 99 is formed in a region of the alumina layer 22 located on the conductive layer 96. Thereafter a ferromagnetic material layer 23 is formed on the overall surface. The overall surface is anisotropically etched thereby forming the sidewall-shaped ferromagnetic layers 23a and 23b as shown in FIG. 16. In this case, the ferromagnetic layer 23a, formed also in the contact hole 99, is electrically connected with the conductive layer 96.

According to the third embodiment, the double junction TMR element 24 consisting of the ferromagnetic layers 21, 23a and 23b can be readily formed through a process similar to a conventional sidewall forming process, as hereinabove described.

As the materials for the ferromagnetic layers 21, 23a and 23b according to the third embodiment, multilayer films consisting of $Co_{75}$—$Fe_{25}$ layers, Py layers and Ta layers are employed for the readily inverted ferromagnetic layers 23a and 23b, while a multilayer film consisting of a $Co_{75}$—$Fe_{25}$ layer, an Ir—Mn layer, a Py layer, a Cu layer, a Py layer and a Ta layer is employed for the hardly inverted ferromagnetic layer 21, for example. These materials for the ferromagnetic layers are disclosed in page 5, "Present Circumstances and Future Prospects of MRAM and Competitive Techniques" (Nov. 17, 2000), Data of the $116^{th}$ Meeting of the Magnetic Society of Japan.

Thereafter the ferromagnetic layers 23a and 23b are patterned in a staggered manner, as shown in FIG. 17. Thus, the double junction TMR elements 24 shown in FIGS. 13 and 14 can be readily formed.

Although the present invention has been described and illustrated in detail, it is clearly understood that the same is by way of illustration and example only and is not to be taken by way of limitation, the spirit and scope of the present invention being limited only by the terms of the appended claims.

While each of the aforementioned embodiments employs the TMR element as the storage element forming each memory cell, for example, the present invention is not restricted to this but a storage element other than the TMR element can also be employed so far as the same exhibits a ferromagnetic tunnel effect. Further, an effect similar to those of the aforementioned embodiments can be attained also when employing a storage element exhibiting a magnetic resistance effect in place of the storage element exhibiting a ferromagnetic tunnel effect.

While the dummy bit line (dummy BL) and the comparator 201 are added to the structure of the first embodiment including the memory cell 52 in the aforementioned second embodiment, the present invention is not restricted to this but a similar effect can be attained also when adding the dummy bit line (dummy BL) and the comparator 201 to the structure of the third embodiment including the memory cell 82.

What is claimed is:

1. A magnetic memory device comprising:

a memory cell consisting of a first storage element and a second storage element exhibiting a ferromagnetic tunnel effect and first and second transistors connected to said first and second storage elements respectively;

a word line connected to control terminals of said first and second transistors;

a bit line connected to said first storage element through said first transistor;

an inverted bit line connected to said second storage element through said second transistor for forming a pair of bit lines with said bit line; and an amplifier connected to said bit line and said inverted bit line, for inputting a signal in selected said word line while reading potential difference caused between said bit line and said inverted bit line by inputting said signal in said word line through said amplifier in data reading.

2. The magnetic memory device according to claim 1, wherein each of said first storage element and said second storage element includes a first magnetic layer and a second magnetic layer, harder to invert than said first magnetic layer, opposed to said first magnetic layer through an isolation barrier layer, and said second magnetic layer of said first storage element and said second magnetic layer of said second storage element are connected with each other, said magnetic memory device further comprising a sub-word line for lowering the potentials of said second magnetic layer of said first storage element and said second magnetic layer of said second storage element to a ground potential in response to a rise timing of said signal to said word line.

3. The magnetic memory device according to claim 2, wherein a current is fed to selected said sub-word line downward from above while feeding currents of opposite directions to said bit line and said inverted bit line in data writing, thereby writing inverted data in said first magnetic layer of said first storage element and said first magnetic layer of said second storage element.

4. The magnetic memory device according to claim 1, wherein a fall timing of said signal to said word line is set before the potential of a second magnetic layer of said first storage element and the potential of a second magnetic layer of said second storage element reach a ground potential.

5. The magnetic memory device according to claim 1, further comprising:

an isolation transistor for isolating said amplifier from said bit line and said inverted bit line in response to a fall timing of said signal to said word line.

6. The magnetic memory device according to claim 1, wherein said first storage element and said second storage element store inverted data.

7. The magnetic memory device according to claim 1, further comprising:

a dummy bit line connected to said first storage element through said first transistor, and a detection circuit detecting a fall timing of said dummy bit line.

8. The magnetic memory device according to claim 7, further comprising:

an isolation transistor for isolating said amplifier from said bit line and said inverted bit line in response to said fall timing of said dummy bit line detected by said detection circuit, wherein said amplifier is activated in response to said fall timing of said dummy bit line detected by said detection circuit.

9. The magnetic memory device according to claim 7, wherein said detection circuit includes a first transistor having a gate receiving an applied input voltage and a second transistor having a gate receiving an applied reference voltage, and a current flowing to said first transistor is rendered larger than a current flowing to said second transistor thereby outputting a low level when said input voltage is equivalent to said reference voltage.

10. The magnetic memory device according to claim 9, wherein the gate width of said first transistor is larger than the gate width of said second transistor.

11. The magnetic memory device according to claim 9, wherein the gate length of said first transistor is smaller than the gate length of said second transistor.

12. A magnetic memory device comprising:

a memory cell consisting of a storage element exhibiting a ferromagnetic tunnel effect including a first magnetic layer, a second magnetic layer having a surface opposed to a surface of said first magnetic layer through a first isolation barrier layer and a third magnetic layer opposed to another surface of said second magnetic layer through a second isolation barrier layer and first and second transistors connected to said first magnetic layer and said third magnetic layer of said storage element respectively;

a word line connected to control terminals of said first and second transistors;

a bit line connected to said first magnetic layer through said first transistor;

an inverted bit line connected to said third magnetic layer through said second transistor for forming a pair of bit lines with said bit line; and an amplifier connected to said bit line and said inverted bit line, for inputting a signal in selected said word line while reading potential difference caused between said bit line and said inverted bit line by inputting said signal in said word line in data writing.

13. The magnetic memory device according to claim 12, wherein said first magnetic layer includes a sidewall-shaped first magnetic layer formed on a side surface of said second magnetic layer through said first isolation barrier layer, and said third magnetic layer includes a sidewall-shaped third magnetic layer formed on another side surface of said second magnetic layer through said second isolation barrier layer.

14. The magnetic memory device according to claim 13, wherein said sidewall-shaped first and third magnetic layers are formed by forming a magnetic material layer through an isolation barrier material layer to cover said second magnetic layer and thereafter anisotropically etching said magnetic material layer.

15. The magnetic memory device according to claim 12, wherein said first magnetic layer and said third magnetic layer are formed in a staggered manner with respect to said second magnetic layer.

16. The magnetic memory device according to claim 12, wherein said second magnetic layer of said storage element is formed to be harder to invert than said first magnetic layer and said third magnetic layer, said magnetic memory device further comprising a sub-word line for lowering the potential of said second magnetic layer of said storage element to a ground potential in response to a rise timing of said signal to said word line.

17. The magnetic memory device according to claim 12, wherein a fall timing of said signal to said word line is set before the potential of said second magnetic layer of said storage element reaches a ground potential.

18. The magnetic memory device according to claim 12, further comprising:

an isolation transistor for isolating said amplifier from said bit line and said inverted bit line in response to a fall timing of said signal to said word line.

19. The magnetic memory device according to claim 12, wherein said first magnetic layer and said third magnetic layer store inverted data.

20. A magnetic memory device comprising a memory cell consisting of:

a storage element exhibiting a ferromagnetic tunnel effect including a first magnetic layer, a second magnetic layer having a surface opposed to a surface of said first magnetic layer through a first isolation barrier layer and a third magnetic layer opposed to another surface of said second magnetic layer through a second isolation barrier layer; and first and second transistors connected to said first magnetic layer and said third magnetic layer of said storage element respectively.

21. The magnetic memory device according to claim 20, wherein said first magnetic layer includes a sidewall-shaped first magnetic layer formed on a side surface of said second magnetic layer through said first isolation barrier layer, and said third magnetic layer includes a sidewall-shaped third magnetic layer formed on another side surface of said second magnetic layer through said second isolation barrier layer.

22. The magnetic memory device according to claim 21, wherein
said sidewall-shaped first and third magnetic layers are formed by forming a magnetic material layer through an isolation barrier material layer to cover said second magnetic layer and thereafter anisotropically etching said magnetic material layer.

23. The magnetic memory device according to claim 20, wherein
said first magnetic layer and said third magnetic layer are formed in a staggered manner with respect to said second magnetic layer.

24. The magnetic memory device according to claim 20, wherein
said first magnetic layer and said third magnetic layer store inverted data.

* * * * *